United States Patent
Tanaka et al.

(10) Patent No.: US 12,231,089 B2
(45) Date of Patent: Feb. 18, 2025

(54) CONTROL CIRCUIT

(71) Applicant: Murata Manufacturing Co., Ltd., Kyoto (JP)

(72) Inventors: Satoshi Tanaka, Kyoto (JP); Fumio Harima, Kyoto (JP); Satoshi Arayashiki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 721 days.

(21) Appl. No.: 17/333,649

(22) Filed: May 28, 2021

(65) Prior Publication Data

US 2021/0376799 A1 Dec. 2, 2021

(30) Foreign Application Priority Data

Jun. 1, 2020 (JP) ................................. 2020-095643

(51) Int. Cl.
| | |
|---|---|
| H03F 1/02 | (2006.01) |
| H03F 1/30 | (2006.01) |
| H03F 3/213 | (2006.01) |
| H03F 1/56 | (2006.01) |
| H03F 3/45 | (2006.01) |

(52) U.S. Cl.
CPC ........... *H03F 1/0288* (2013.01); *H03F 1/301* (2013.01); *H03F 3/213* (2013.01); *H03F 1/56* (2013.01); *H03F 3/45* (2013.01); *H03F 2200/387* (2013.01); *H03F 2200/451* (2013.01)

(58) Field of Classification Search
CPC ........ H03F 1/0288; H03F 1/301; H03F 3/213; H03F 1/56; H03F 3/45; H03F 2200/387; H03F 2200/451; H03F 1/07; H03F 1/30; H03F 2200/183; H03F 2200/21
USPC .................................................. 330/252, 51
See application file for complete search history.

(56) References Cited

U.S. PATENT DOCUMENTS

| | | | |
|---|---|---|---|
| 7,532,449 B2 * | 5/2009 | Higemoto | H03F 3/04 361/104 |
| 2008/0061745 A1 | 3/2008 | Nodo | |
| 2009/0206926 A1 | 8/2009 | Horiguchi et al. | |
| 2014/0077874 A1 * | 3/2014 | Ahmed | H03F 3/195 330/124 R |
| 2014/0253243 A1 | 9/2014 | Hagisawa et al. | |
| 2014/0347130 A1 | 11/2014 | Iijima et al. | |
| 2015/0038092 A1 | 2/2015 | Andrys et al. | |
| 2016/0126921 A1 * | 5/2016 | Hur | H01Q 1/50 333/2 |
| 2017/0033748 A1 * | 2/2017 | Rajendran | H03F 3/245 |
| 2017/0126181 A1 | 5/2017 | Embar et al. | |

(Continued)

FOREIGN PATENT DOCUMENTS

| | | |
|---|---|---|
| CN | 101228689 A | 7/2008 |
| JP | H11-003966 A | 1/1999 |
| JP | 2011109382 A | 6/2011 |

(Continued)

*Primary Examiner* — Andrea Lindgren Baltzell
*Assistant Examiner* — Khiem D Nguyen
(74) *Attorney, Agent, or Firm* — McDonald Hopkins LLC

(57) ABSTRACT

A control circuit is configured to control a Doherty amplifier including a carrier amplifier and a peak amplifier. The control circuit includes a resistor having a resistance value that is irreversibly adjustable. The resistor is configured to determine, based on the resistance value, a bias of the peak amplifier. The control circuit controls a Doherty amplifier.

21 Claims, 15 Drawing Sheets

(56) References Cited

U.S. PATENT DOCUMENTS

2018/0026583 A1    1/2018   Yanduru et al.
2022/0006427 A1*   1/2022   Sugimoto ............... H03F 3/245

FOREIGN PATENT DOCUMENTS

| JP | 2012199746 A | 10/2012 |
| JP | 2014171170 A | 9/2014 |
| JP | 2015039087 A | 2/2015 |
| KR | 10-2008-0023168 A | 3/2008 |
| WO | 2007/015462 A1 | 2/2007 |

* cited by examiner

CONTROL CIRCUIT

CROSS REFERENCE TO RELATED APPLICATION

This application claims priority from Japanese Patent Application No. 2020-095643 filed on Jun. 1, 2020. The content of this application is incorporated herein by reference in its entirety.

BACKGROUND OF THE DISCLOSURE

1. Field of the Disclosure

The present disclosure relates to a control circuit that controls a Doherty amplifier.

2. Description of the Related Art

Japanese Unexamined Patent Application Publication No. 2012-199746 (hereinafter Patent Document 1) describes a technique about a bias circuit for a Doherty amplifier. Japanese Unexamined Patent Application Publication No. 2014-171170 describes a technique of compensating for temperature characteristics of an amplifier circuit.

BRIEF SUMMARY OF THE DISCLOSURE

In the technique described in Patent Document 1, a gate voltage of a field-effect transistor (FET) of a peak amplifier is set to a voltage obtained by offsetting a gate voltage of a FET of a carrier amplifier. This is based on the assumption that drain current characteristics to gate voltages of the FETs of the peak amplifier and the carrier amplifier are expected to be substantially the same when the FETs of the peak amplifier and the carrier amplifier are included in the same wafer lot or when the FETs are manufactured in the same manufacturing period.

However, the technique described in Patent Document 1 is not based on consideration about variation in output power-gain characteristics and output power-phase characteristics of the peak amplifier and the carrier amplifier resulting from variation in operation thresholds caused by individual differences of the peak amplifier and the carrier amplifier.

Accordingly, it is an object of the present disclosure to reduce variation in characteristics.

According to preferred embodiments of the present disclosure, a control circuit is configured to control a Doherty amplifier including a carrier amplifier and a peak amplifier. The control circuit includes a resistor having a resistance value that is irreversibly adjustable. The resistor is configured to determine, based on the resistance value, a bias of the peak amplifier.

According to the preferred embodiments of the present disclosure, it is possible to reduce variation in characteristics. Other features, elements, characteristics and advantages of the present disclosure will become more apparent from the following detailed description of preferred embodiments of the present disclosure with reference to the attached drawings.

DETAILED DESCRIPTION OF THE DISCLOSURE

Hereinafter, control circuits according to embodiments of the present disclosure will be described in detail with reference to the drawings. The present disclosure is not limited to these embodiments. Each of the embodiments is an example, and it is obvious that elements illustrated in different embodiments can be partially replaced or combined. In a second embodiment and subsequent embodiments, the same features as those of a first embodiment will not be described, and only differences will be described. In particular, similar functions and effects of similar configurations will not be repeatedly described in each embodiment.

FIRST EMBODIMENT AND COMPARATIVE EXAMPLE

Hereinafter, the first embodiment will be described. To facilitate the understanding of the first embodiment, a comparative example will be described first.

Comparative Example

Figure 1:
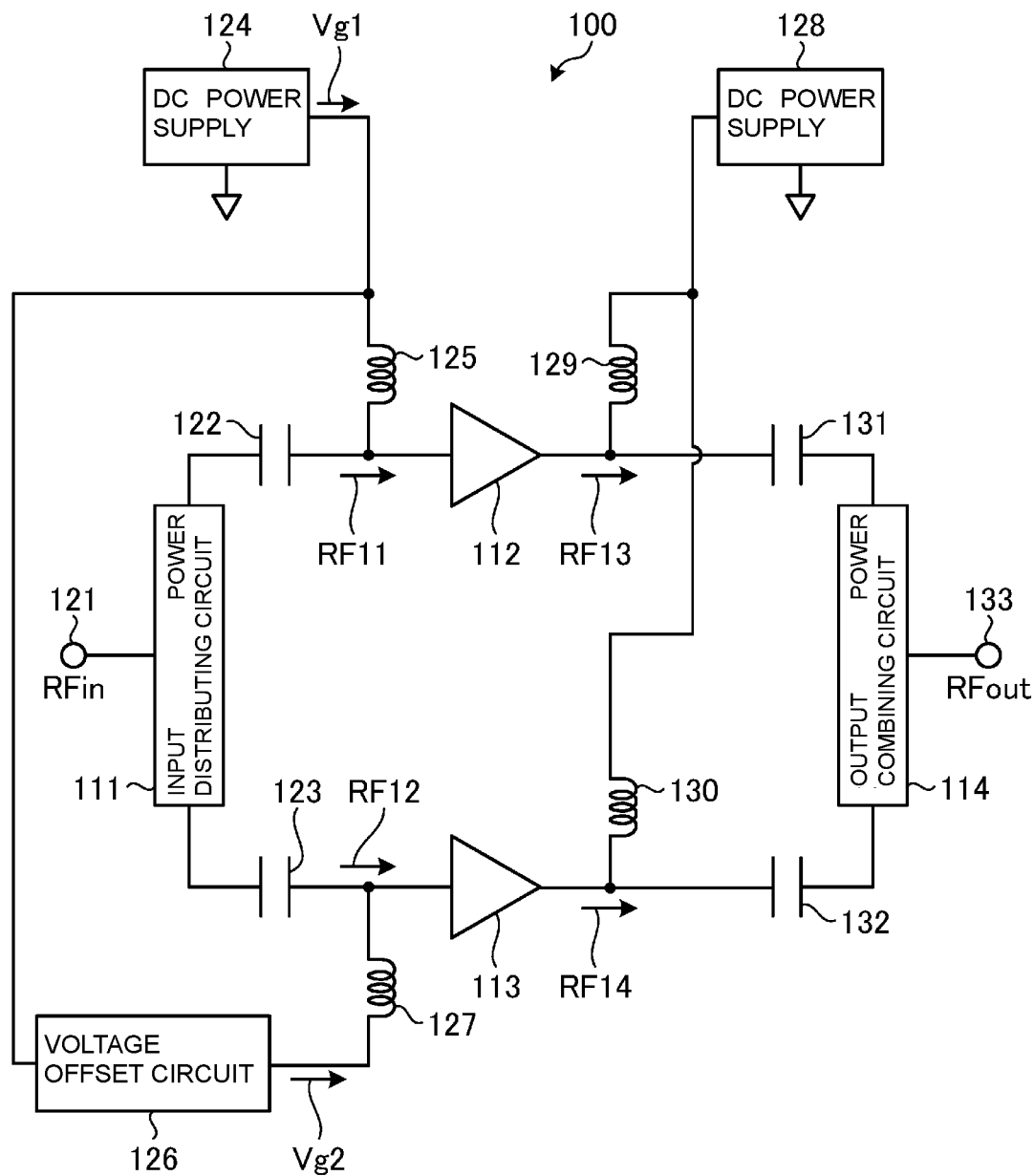
FIG. 1 is a diagram illustrating the configuration of a Doherty amplifier according to a comparative example.

FIG. 1 is a diagram illustrating the configuration of a Doherty amplifier 100 according to the comparative example. The Doherty amplifier 100 includes an input power distributing circuit 111, a carrier amplifier 112, a peak amplifier 113, and an output power combining circuit 114.

The input power distributing circuit 111 outputs a radio-frequency (RF) input signal RFin inputted from an input terminal 121 by distributing the signal to two paths. An RF signal RF11, which is one output signal from the input power distributing circuit 111, is supplied to a gate of a field-effect transistor (FET) constituting the carrier amplifier 112 via a direct-current (DC) cut capacitor 122. An RF signal RF12, which is the other output signal from the input power distributing circuit 111, is supplied to a gate of a FET constituting the peak amplifier 113 via a DC cut capacitor 123.

The carrier amplifier 112 is, for example, a power amplifier including a FET, and constantly amplifies the RF signal RF11 inputted from the input power distributing circuit 111. A bias voltage Vg1 is applied to the gate of the FET constituting the carrier amplifier 112 from a DC power supply 124 via a choke coil 125. The bias voltage Vg1 is set such that the carrier amplifier 112 is class AB biased (or class A biased or class B biased). In addition, a DC voltage (for example, +28 V) is applied to a drain of the FET constituting the carrier amplifier 112 from a DC power supply 128 via a choke coil 129.

The bias voltage Vg1 outputted from the DC power supply 124 is also supplied to a voltage offset circuit 126. The voltage offset circuit 126 offsets the bias voltage Vg1 by a predetermined voltage Voffset to generate a bias voltage Vg2 for the peak amplifier 113.

The peak amplifier 113 is, for example, a power amplifier including a FET, and amplifies a peak of the RF signal RF12 inputted from the input power distributing circuit 111. The bias voltage Vg2 is applied to the gate of the FET constituting the peak amplifier 113 from the voltage offset circuit 126 via a choke coil 127. The bias voltage Vg2 is set such that the peak amplifier 113 is class C biased. In addition, a DC voltage (for example, +28 V) is applied to a drain of the FET constituting the peak amplifier 113 from the DC power supply 128 via a choke coil 130.

The components used for the carrier amplifier 112 and the peak amplifier 113 have a common element about devices, such as a wafer lot or a manufacturing period.

An RF signal RF13, which is an output signal from the carrier amplifier 112, is supplied to the output power combining circuit 114 via a DC cut capacitor 131. An RF signal RF14, which is an output signal from the peak amplifier 113, is supplied to the output power combining circuit 114 via a DC cut capacitor 132. The output power combining circuit 114 outputs an RF output signal RFout, which is obtained by combining the RF signal RF13 and the RF signal RF14, from an output terminal 133.

As described above, in the Doherty amplifier 100, the bias voltage Vg1 for the carrier amplifier 112 is supplied from the DC power supply 124. On the other hand, the bias voltage Vg2 for the peak amplifier 113 is generated by the voltage offset circuit 126 by offsetting the bias voltage Vg1 by the voltage Voffset, and is supplied from the voltage offset circuit 126 to the gate of the FET constituting the peak amplifier 113.

The Doherty amplifier 100 has a characteristic that the carrier amplifier 112 performs class AB operation (or class A operation or class B operation) whereas the peak amplifier 113 performs class C operation. To achieve the operation, the bias voltage Vg2 is set to a voltage that is lower than the bias voltage Vg1 for the carrier amplifier 112 by the voltage Voffset.

In the Doherty amplifier 100, only the carrier amplifier 112, which is class AB biased, operates when the RF input signal RFin is small. In the Doherty amplifier 100, the peak amplifier 113, which is class C biased, starts operating when the RF input signal RFin becomes large. The Doherty amplifier 100 shifts to an operation of outputting high output power when the load impedance of the carrier amplifier 112 decreases in accordance with the start of operation of the peak amplifier 113.

In this way, the amplification operation of the Doherty amplifier 100 is changed in accordance with the level of the RF input signal RFin. Thus, the output power-gain characteristics and the output power-phase characteristics of the Doherty amplifier 100 change at the timing at which the peak amplifier 113 starts operating. This change causes the RF output signal RFout to be distorted and leads to an increase in adjacent channel leakage power (ACP), that is, degradation in adjacent channel leakage ratio (ACLR), or an increase (degradation) in error vector magnitude (EVM). In the case of using the Doherty amplifier 100, a digital pre-distortion (DPD) technique is used to suppress (cancel) distortion of the RF output signal RFout. The DPD technique uses a data table for adding a numerical value corresponding to distortion having an inverse characteristic of distortion of the Doherty amplifier 100 to the RF input signal RFin in advance.

However, the Doherty amplifier 100 according to the comparative example is not based on consideration about variation in output power-gain characteristics and output power-phase characteristics of the transistors of the carrier amplifier 112 and the peak amplifier 113 resulting from variation in operation thresholds caused by individual differences of the transistors of the carrier amplifier 112 and the peak amplifier 113.

For example, when the operation threshold of the transistor constituting the carrier amplifier 112 and the operation threshold of the transistor constituting the peak amplifier 113 are different from each other, relative bias conditions are different even if the voltage Voffset is constant. Thus, the level of the RF input signal RFin at which the peak amplifier 113 starts operating varies, and variation occurs in the output power-gain characteristics and the output power-phase characteristics of the peak amplifier 113.

Figure 2:
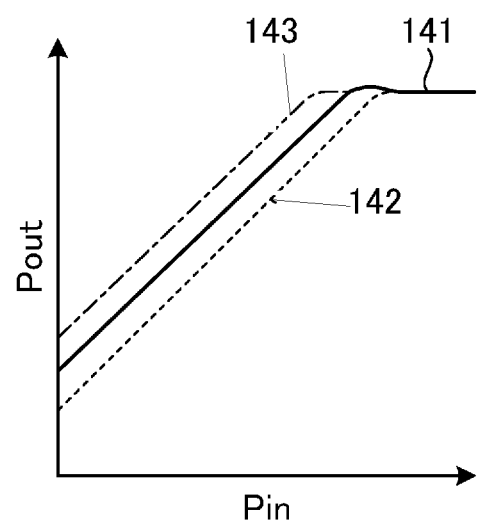
FIG. 2 is a graph illustrating input/output characteristics of a class AB amplifier.

FIG. 2 is a graph illustrating input/output characteristics of a class AB amplifier. In FIG. 2, the horizontal axis represents input power Pin and the vertical axis represents output power Pout. A line 141 represents an example of the input/output characteristics of the class AB amplifier. The relationship between the input power Pin and the output power Pout is linear until the input power Pin reaches a certain level. When the input power Pin increases and the transistor is saturated, the output power Pout reaches a limit (saturation). The gain of the class AB amplifier varies, for example, in the range from a line 142 to a line 143, due to the level of a bias current (bias voltage) of the transistor, the characteristics of the transistor, individual differences of input/output matching circuits, and so forth. The variation can be reduced by adjusting the bias voltage or bias current.

Figure 3:
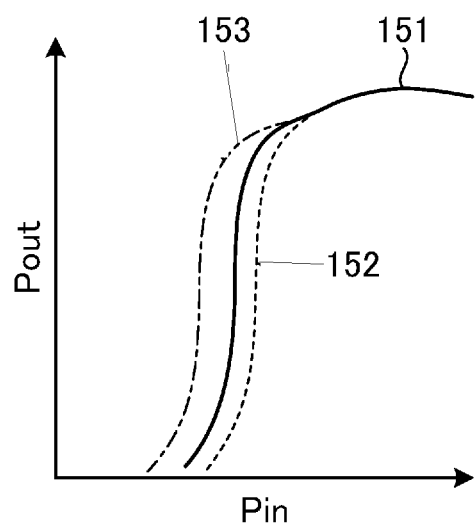
FIG. 3 is a graph illustrating input/output characteristics of a class C amplifier.

FIG. 3 is a graph illustrating input/output characteristics of a class C amplifier. In FIG. 3, the horizontal axis represents input power Pin and the vertical axis represents output power Pout. A line 151 represents an example of the input/output characteristics of the class C amplifier. The class C amplifier does not operate until the input power Pin reaches a certain level. When the input power Pin reaches the certain level and the class C amplifier starts operating, the gain of the class C amplifier increases in accordance with an increase in input power Pin. Finally, when the input power Pin increases and the transistor is saturated, the output power Pout reaches a limit (saturation), as in the class AB amplifier. The gain of the class C amplifier varies, for example, in the range from a line 152 to a line 153, due to the level of a bias current (bias voltage) of the transistor, the characteristics of the transistor, individual differences of input/output matching circuits, and so forth.

The level of the RF input signal RFin at which the class C amplifier starts operating depends on the level of a bias current (bias voltage) of the transistor and the RF signal amplitude at the base (gate) of the transistor, and varies according to the level of the bias current and individual differences of an input matching circuit. Variation in the characteristics of the carrier amplifier 112 and variation in characteristics of the peak amplifier 113 are different in factor, and thus both are not necessarily correlated with each other strongly and may independently fluctuate.

In the case of using the Doherty amplifier 100 for a base station of mobile phones, for example, there is a training-specific timing of appropriately setting a table to reduce distortion by changing the setting of DPD, and thus the above-described variation is not a substantial problem.

However, in the case of using the Doherty amplifier 100 for a wireless communication terminal apparatus, such as a mobile phone apparatus, for example, there is no training-specific timing, and it is difficult to reduce variation in characteristics resulting from individual differences. DPD tables for respective wireless communication terminal apparatuses may be created before shipment of the terminal apparatuses to reduce variation in characteristic resulting from individual differences. However, this involves an increase in the cost of testing before shipment of the terminal apparatuses. Thus, it is desired to reduce variation in output power-gain characteristics and output power-phase characteristics resulting from individual differences.

Figure 4:
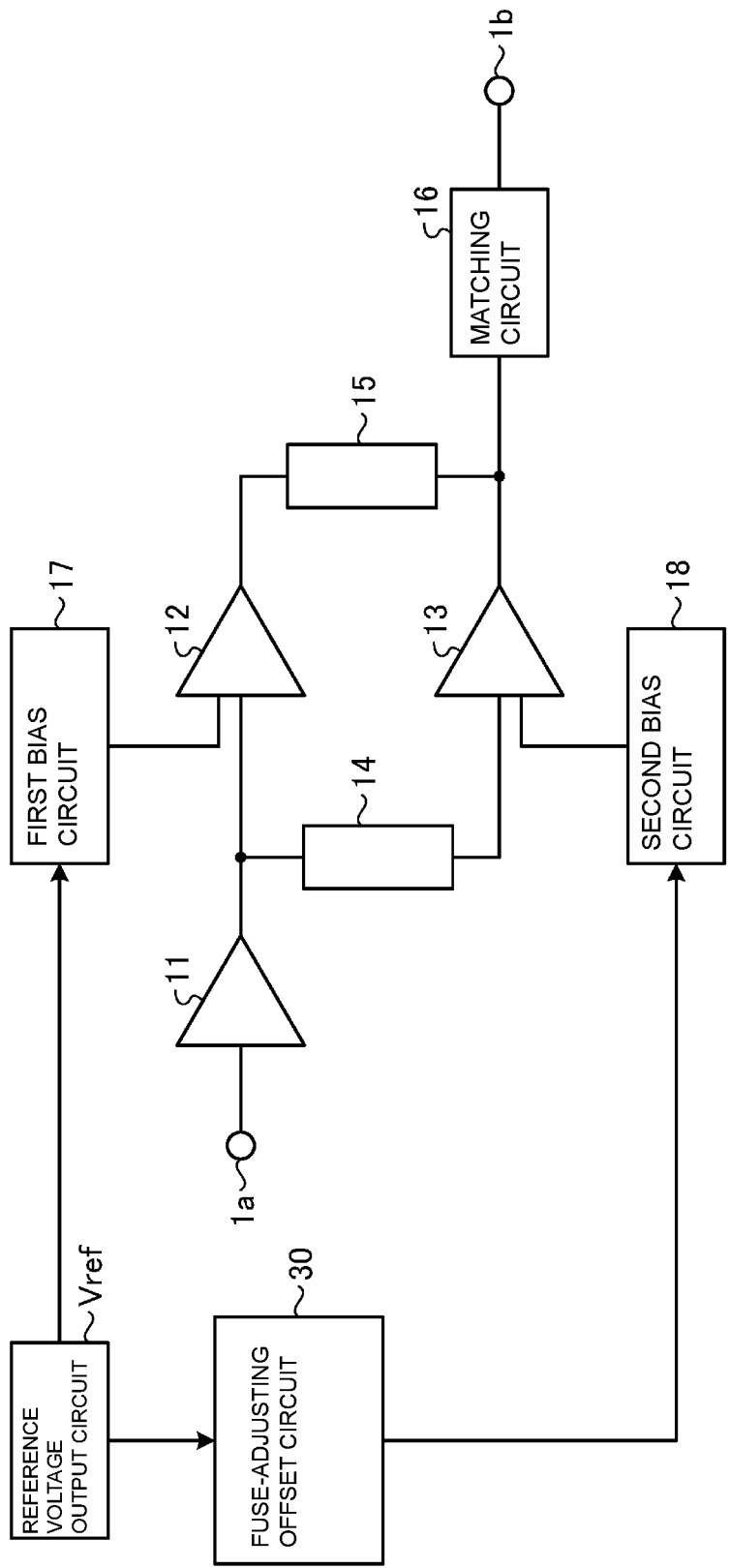
FIG. 4 is a diagram illustrating a circuit configuration of a power amplifier module as a concept of one or more embodiments of the present disclosure.

FIG. 4 is a circuit diagram conceptually illustrating the thought of one or more embodiments of the present disclosure.

In the configuration illustrated in FIG. 4, in contrast to the Doherty amplifier 100 according to the comparative example illustrated in FIG. 1, a second bias circuit 18 is driven via a fuse-adjusting offset circuit 30 on the basis of a voltage of a reference voltage output circuit Vref in order to secure the operation of a peak amplifier 13. Adjusting of a voltage value or a current value using the fuse-adjusting offset circuit 30 secures the operation of the peak amplifier 13.

First Embodiment

Figure 5:
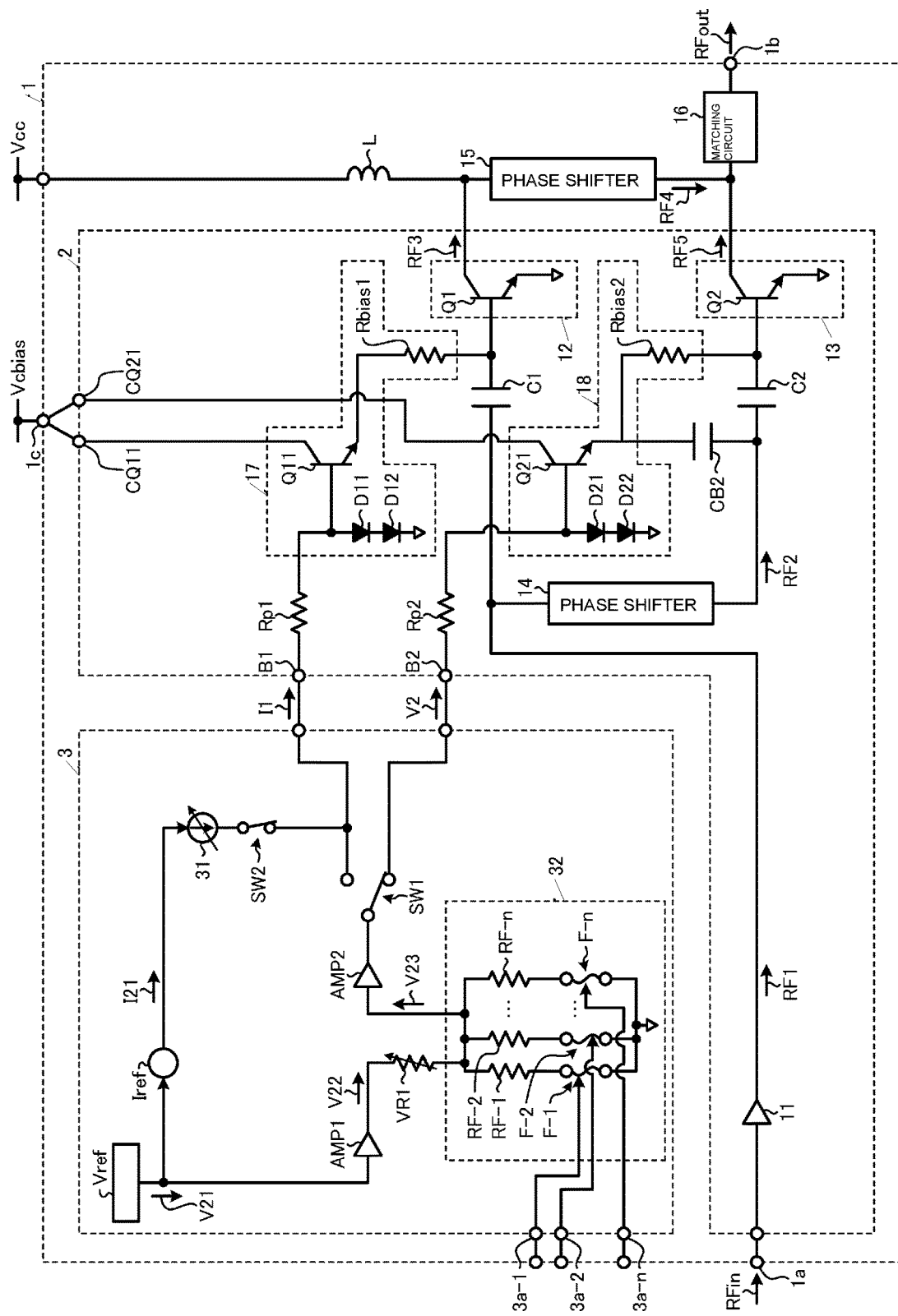
FIG. 5 is a diagram illustrating a circuit configuration of a power amplifier module according to a first embodiment.

FIG. 5 is a diagram illustrating a circuit configuration of a power amplifier module 1 according to the first embodiment.

The power amplifier module 1 may be implemented by a hybrid integrated circuit (IC), which may be referred to as a module, including a plurality of components (semiconductor ICs or the like) disposed on a single substrate, but the present disclosure is not limited thereto. The power amplifier module 1 is used to, for example, transmit various signals, such as audio signals and data signals, to a base station by a wireless communication terminal apparatus, such as a mobile phone apparatus.

The power amplifier module 1 includes a first IC (first IC chip) 2 and a second IC (second IC chip) 3. The first IC 2 is disposed on, for example, a compound semiconductor substrate (for example, a GaAs substrate), but the present disclosure is not limited thereto. The second IC 3 is disposed on, for example, a semiconductor substrate (for example, a Si substrate), but the present disclosure is not limited thereto.

The second IC 3 corresponds to an example of a "control circuit" according to the present disclosure.

The first IC 2 includes a driver amplifier 11 in the first stage (driver stage), and a carrier amplifier 12 and the peak amplifier 13 in the last stage (power stage). The carrier amplifier 12 and the peak amplifier 13 constitute a Doherty amplifier.

The carrier amplifier 12 includes a transistor Q1. The peak amplifier 13 includes a transistor Q2. The transistor Q1 is class AB biased (or class A biased or class B biased) by a first bias circuit 17. The transistor Q2 is class C biased by the second bias circuit 18.

Hereinafter, the first bias circuit 17 and the carrier amplifier 12 may be collectively referred to as a "carrier amplifier system". Also, the second bias circuit 18 and the peak amplifier 13 may be collectively referred to as a "peak amplifier system".

In the present disclosure, each transistor is a bipolar transistor, but the present disclosure is not limited thereto. The bipolar transistor is, for example, a heterojunction bipolar transistor (HBT), but the present disclosure is not limited thereto. The transistor may be, for example, a field-effect transistor (FET). The transistor may be a multi-finger transistor including a plurality of unit transistors that are electrically connected in parallel to each other. Each unit transistor is a minimum element of the transistor.

An RF input signal RFin is inputted to the driver amplifier 11 via a terminal 1a. The driver amplifier 11 amplifies the RF input signal RFin and outputs an amplified RF signal RF1.

An output terminal of the driver amplifier 11 is electrically connected to one end of a DC cut capacitor C1 and one end of a phase shifter 14. The other end of the DC cut capacitor C1 is electrically connected to a base of the transistor Q1. The RF signal RF1 is supplied to the base of the transistor Q1 via the DC cut capacitor C1.

The phase shifter 14 outputs an RF signal RF2, the phase thereof being advanced or delayed by about 90 degrees relative to the phase of the RF signal RF1. In the present disclosure, "about 90 degrees" mean 90 degrees ±20 degrees.

The other end of the phase shifter 14 is electrically connected to a base of the transistor Q2 via a DC cut capacitor C2. The RF signal RF2 is supplied to the base of the transistor Q2 via the DC cut capacitor C2.

An emitter of the transistor Q1 is electrically connected to a reference potential. The reference potential is, for example, a ground potential, but the present disclosure is not limited thereto. A collector of the transistor Q1 is electrically connected to a power supply potential Vcc via a choke inductor L. The transistor Q1 outputs, from the collector thereof, an RF signal RF3 that is obtained by amplifying the RF signal RF1.

One end of a phase shifter 15 is electrically connected to the collector of the transistor Q1. The other end of the phase shifter 15 is electrically connected to a collector of the transistor Q2.

The phase shifter 15 outputs an RF signal RF4, the phase thereof being advanced or delayed by about 90 degrees relative to the phase of the RF signal RF3.

The phase shifter 15 advances the phase of the RF signal RF3 by about 90 degrees in a case where the phase shifter 14 advances the phase of the RF signal RF1 by about 90 degrees. The phase shifter 15 delays the phase of the RF signal RF3 by about 90 degrees in a case where the phase shifter 14 delays the phase of the RF signal RF1 by about 90 degrees.

An emitter of the transistor Q2 is electrically connected to a reference potential. The transistor Q2 outputs, from the collector thereof, an RF signal RF5 obtained by amplifying the RF signal RF2.

The other end of the phase shifter 15 and the collector of the transistor Q2 are electrically connected to a terminal 1b via a matching circuit 16. The RF signal RF4 and the RF signal RF5 are superimposed on one another and output as an RF output signal RFout from the terminal 1b via the matching circuit 16.

When the RF input signal RFin is small, the carrier amplifier 12 (the transistor Q1) operates whereas the peak amplifier 13 (the transistor Q2) does not operate. In this case, the load impedance of the carrier amplifier 12 is an impedance RL of the matching circuit 16. This is because no impedance change occurs in the phase shifter 15.

When the RF input signal RFin becomes large, the carrier amplifier 12 (the transistor Q1) approaches saturation and the peak amplifier 13 (the transistor Q2) starts operating at the same time. In this case, the phase of the RF signal RF5 applied from the peak amplifier 13 to the matching circuit 16 is the same as the phase of the RF signal RF4 applied from the carrier amplifier 12 to the matching circuit 16 via the phase shifter 15. At this time, the signal amplitude at the collector of the transistor Q2 increases, and thus the load impedance (the impedance of the matching circuit 16) equivalently increases as seen from the peak amplifier 13. The equivalent change in the impedance is transmitted to the carrier amplifier 12 via the phase shifter 15. The load impedance decreases as seen from the carrier amplifier 12, and thus the saturation power (maximum power) of the carrier amplifier 12 increases.

In a state in which the peak amplifier 13 is finally saturated, the load impedance (the impedance of the matching circuit 16) is 2RL as seen from the peak amplifier 13, and the load impedance is RL/2 as seen from the carrier amplifier 12.

With this operation, the carrier amplifier 12 once approaches saturation. However, the load impedance decreases as seen from the carrier amplifier 12, and thus the carrier amplifier 12 is capable of outputting a larger output. The carrier amplifier 12 operates near saturation and is thus capable of achieving high efficiency in a wide power range.

Figure 6:
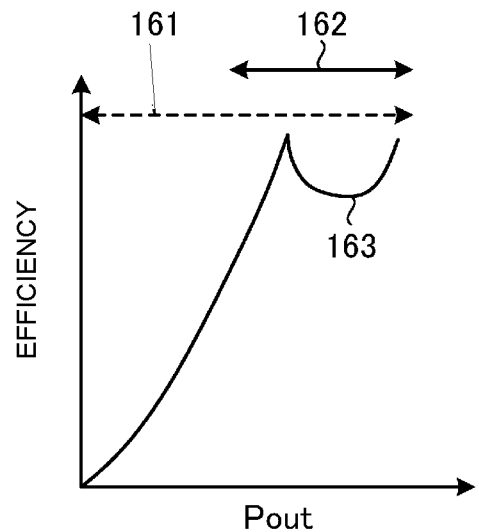
FIG. 6 is a graph illustrating characteristics of a Doherty amplifier.
Figure 7:
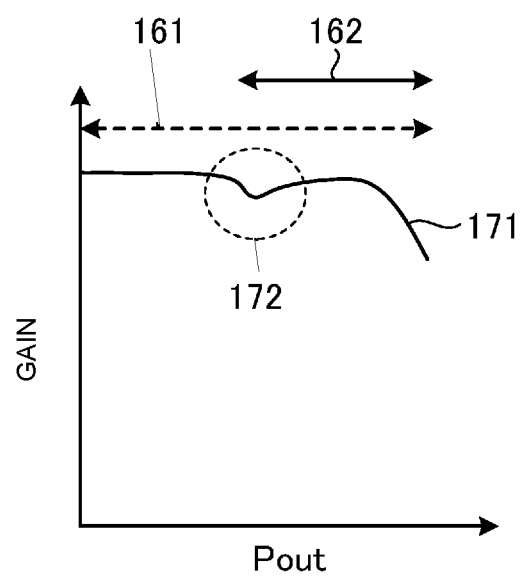
FIG. 7 is a graph illustrating characteristics of the Doherty amplifier.

FIG. 6 and FIG. 7 are graphs each illustrating characteristics of the Doherty amplifier. Specifically, FIG. 6 is a graph illustrating the relationship between output power and efficiency of the Doherty amplifier. FIG. 7 is a graph illustrating the relationship between output power and gain of the Doherty amplifier.

In FIG. 6, the horizontal axis represents output power Pout, and the vertical axis represents efficiency. An arrow 161 indicates the range of the output power Pout in which the carrier amplifier 12 operates. An arrow 162 indicates the range of the output power Pout in which the peak amplifier 13 operates. As indicated by a line 163, high efficiency is achieved from the level of the output power Pout at which the carrier amplifier 12 operates near saturation to the level at which the load impedance decreases to half and saturation occurs.

In FIG. 7, the horizontal axis represents output power Pout, and the vertical axis represents gain. As indicated by a line 171, the non-linearity of the Doherty amplifier becomes apparent particularly in a region 172 in which the peak amplifier 13 starts operating.

In this way, the amplification operation of the Doherty amplifier is changed in the region 172 that corresponds to the timing at which the peak amplifier 13 starts operating. Thus, the output power-gain characteristics and the output power-phase characteristics of the Doherty amplifier change in the region 172. This change causes the RF output signal RFout to be distorted and leads to an increase in ACP, that is, degradation in ACLR, or an increase (degradation) in EVM.

As described above, in the DPD technique, a digital signal processor of a transmission circuit generates distortion having an inverse characteristic of distortion of the Doherty amplifier in the region 172 and adds the generated distortion to the RF input signal RFin, thereby suppressing degradation in ACLR or EVM resulting from distortion of the RF output signal RFout. Distortion of the Doherty amplifier tends to be changed by individual differences of bipolar transistors included in the first IC 2. For example, when the transistors Q1 and Q2 have individual differences and the operation thresholds thereof are different from each other, relative bias conditions are different. Accordingly, the timing at which the peak amplifier 13 (the transistor Q2) starts operating varies. In other words, the region 172 shifts in a right or left direction in FIG. 7. To apply the Doherty amplifier to a wireless communication terminal apparatus, it is important to reduce changes in distortion of the Doherty amplifier, in other words, to suppress shift of the region 172 in a right or left direction in FIG. 7.

Referring back to FIG. 5, a description will be given of the bias of the carrier amplifier 12 and the peak amplifier 13. The second IC 3 outputs a current I1 to the first bias circuit 17 and outputs a voltage V2 to the second bias circuit 18.

Generation of the current I1 will be described. The reference voltage output circuit Vref in the second IC 3 outputs a reference voltage V21 to a reference current output circuit Iref.

The reference current output circuit Iref outputs a reference current I21 that is based on the reference voltage V21 to a variable constant current output circuit 31. The variable constant current output circuit 31 outputs the current I1 proportional to the reference current I21 to a terminal B1 of the first IC 2.

The first IC 2 includes a resistor Rp1 and the first bias circuit 17. The first bias circuit 17 includes diodes D11 and D12, a transistor Q11, and a resistor Rbias1. Each of the diodes D11 and D12 is, for example, an HBT having a base and a collector electrically connected to each other, that is, a diode-connected HBT.

One end of the resistor Rp1 is electrically connected to the terminal B1. The other end of the resistor Rp1 is electrically connected to an anode of the diode D11. A cathode of the diode D11 is electrically connected to an anode of the diode D12. A cathode of the diode D12 is electrically connected to a reference potential. A series-connected circuit made up of the diodes D11 and D12 generates a constant voltage. For example, assuming that each of the diodes D11 and D12 generates a voltage of about 1.3 V, the series-connected circuit made up of the diodes D11 and D12 generates a voltage of about 2.6 V.

The voltage of the series-connected circuit made up of the diodes D11 and D12 is applied to a base of the transistor Q11. A collector of the transistor Q11 is electrically connected to a power supply potential Vcbias via a terminal CQ11 and a terminal 1c. An emitter of the transistor Q11 is electrically connected to the base of the transistor Q1 via the resistor Rbias1. In other words, the transistor Q11 and the resistor Rbias1 are emitter-follower connected. A base current of the transistor Q1 is determined on the basis of a voltage applied to the base of the transistor Q11.

Generation of the voltage V2 will be described. A buffer amplifier AMP1 in the second IC 3 outputs a voltage V22 that is based on the reference voltage V21 to one end of a variable resistor VR1. The voltage V22 is, for example, the same as the reference voltage V21, but the present disclosure is not limited thereto. A series circuit made up of the variable resistor VR1 and a resistor array 32 divides the voltage V22 by using resistance and outputs a voltage V23.

The resistor array 32 includes n resistance elements RF-1, RF-2, . . . , and RF-n (n is a natural number) and n electronic fuses (E fuses) F-1, F-2, . . . , and F-n. One ends of the resistance elements RF-1, RF-2, . . . , and RF-n are electrically connected to each other and are electrically connected to the other end of the variable resistor VR1. The other ends of the resistance elements RF-1, RF-2, . . . , and RF-n are electrically connected to each other via the E fuses F-1, F-2, . . . , and F-n, respectively, and are electrically connected to a reference potential. In other words, the resistance elements RF-1, RF-2, . . . , and RF-n are connected in parallel to each other.

The resistance values of the resistance elements RF-1, RF-2, . . . , and RF-n may be identical to or different from each other. Hereinafter, the resistance elements RF-1, RF-2, . . . , and RF-n may be collectively referred to as resistance elements RF.

The E fuses F-1, F-2, . . . , and F-n are electrically connected to n terminals 3a-1, 3a-2, . . . , and 3a-n, respectively. Selective application of a voltage or current to the terminals 3a-1, 3a-2, . . . , and 3a-n makes it possible to selectively blow out the E fuses F-1, F-2, . . . , and F-n. Selective blowout of the E fuses F-1, F-2, . . . , and F-n makes it possible to vary the resistance value of the resistor array 32. For example, blowout of the E fuse F-1 causes the resistance element RF-1 not to affect the resistance value of the resistor array 32, and thus the resistance value of the resistor array 32 increases.

Hereinafter, the E fuses F-1, F-2, . . . , and F-n may be collectively referred to as E fuses F.

The E fuses F are irreversible elements that do not recover when blown out. The resistance value of the resistor array 32 is the smallest in an initial state (when none of the E fuses F has been blown out), and irreversibly increases as the E fuses F are blown out. In other words, the resistance value of the resistor array 32 is irreversibly adjustable.

Figure 8:
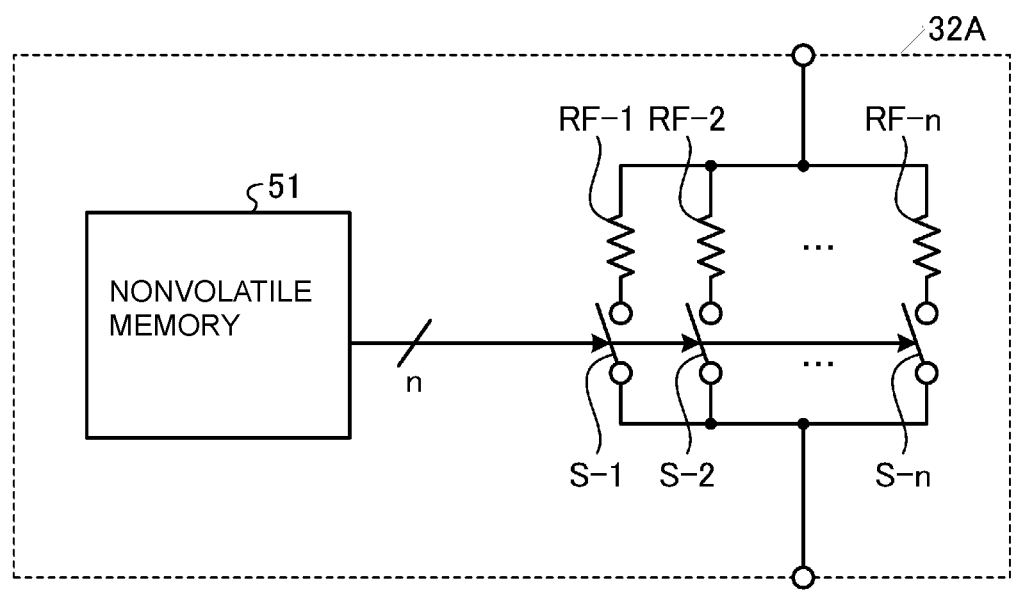
FIG. 8 is a diagram illustrating another example of a resistor array

FIG. 8 is a diagram illustrating another example of a resistor array.

A resistor array 32A includes n resistance elements RF-1, RF-2, . . . , and RF-n, and n switches S-1, S-2, . . . , and S-n. One ends of the resistance elements RF-1, RF-2, . . . , and RF-n are electrically connected to each other. The other ends of the resistance elements RF-1, RF-2, . . . , and RF-n are electrically connected to each other via the switches S-1, S-2, . . . , and S-n, respectively.

A nonvolatile memory 51 stores n-bit data and outputs a signal having an n-bit width to the switches S-1, S-2, . . . , and S-n. Each of the switches S-1, S-2, . . . , and S-n is turned on or off in accordance with the signal supplied thereto. The resistance value of the resistor array 32A can be changed by selectively turning on or off the switches S-1, S-2, . . . , and S-n. For example, when the switch S-1 is turned off, the resistance element RF-1 does not affect the resistance value of the resistor array 32A, and thus the resistance value of the resistor array 32A increases. As a result of writing data on the nonvolatile memory 51, the switches S-1, S-2, . . . , and S-n can be switched between on and off, and the resistance value of the resistor array 32A can be changed.

The nonvolatile memory 51 is, for example, a one-time read-only memory (ROM). The one-time ROM is an irreversible element that is not rewritable after data has been written thereon. In other words, the resistance value of the resistor array 32A is irreversible.

The resistor arrays 32 and 32A each correspond to an example of a "resistor" according to the present disclosure.

The variable resistor VR1 is implemented by, for example, a circuit configuration similar to that illustrated in FIG. 8. The resistance value of the variable resistor VR1 can be reversibly changed by using an erasable programmable read-only memory (EPROM), a flash memory (registered trademark), or the like as the nonvolatile memory 51.

Referring back to FIG. 5, the voltage V23 can be adjusted by adjusting the resistance value of the resistor array (and the resistance value of the variable resistor VR1).

When the resistance value of the variable resistor VR1 is kept constant, the voltage V23 rises as the resistance value of the resistor array 32 increases. In other words, the voltage V23 is a voltage obtained by adjusting the voltage V22 in accordance with the resistance value of the resistor array 32.

A buffer amplifier AMP2 outputs the voltage V2 that is based on the voltage V23 to a terminal B2 of the first IC 2. The voltage V2 is, for example, the same as the voltage V23, but the present disclosure is not limited thereto. The voltage V23 can be adjusted by adjusting the resistance value of the resistor array (and the resistance value of the variable resistor VR1). Thus, the voltage V2 can be adjusted by adjusting the resistance value of the resistor array 32 (and the resistance value of the variable resistor VR1).

The first IC 2 includes a resistor Rp2 and the second bias circuit 18. The second bias circuit 18 includes diodes D21 and D22, a transistor Q21, and a resistor Rbias2. Each of the diodes D21 and D22 is, for example, a diode-connected HBT.

One end of the resistor Rp2 is electrically connected to the terminal B2. The other end of the resistor Rp2 is electrically connected to an anode of the diode D21. A cathode of the diode D21 is electrically connected to an anode of the diode D22. A cathode of the diode D22 is electrically connected to a reference potential.

The anode of the diode D21 is electrically connected to a base of the transistor Q21. A collector of the transistor Q21 is electrically connected to the power supply potential Vcbias via a terminal CQ21 and the terminal 1c. An emitter of the transistor Q21 is electrically connected to the base of the transistor Q2 via the resistor Rbias2. In other words, the transistor Q21 and the resistor Rbias2 are emitter-follower connected.

The voltage V2 has a value smaller than the double of the ON-voltage (for example, about 1.3 V) of each of the diodes D21 and D22 which are diode-connected HBTs, that is, for example, about 2.6 V, and may be from about 2.1 V to about 2.2 V. Even when the voltage V2 is applied to the terminal B2, no current flows through the diodes D21 and D22 because the voltage V2 is lower than the ON-voltage of the series-connected circuit made up of the diodes D21 and D22. Also, the transistors Q21 and Q2 do not operate.

In response to the input of the RF input signal RFin, the current flowing through the transistors increases in accordance with an increase in the input RF signal. At this time, a self-bias effect occurs in which the ON-voltage of a base-emitter diode drops in terms of DC. When the ON threshold voltage of the diode (the pn junction between the base and the emitter) of each of the transistors Q2 and Q21 starts dropping as a result of the self-bias effect, the transistors Q2 and Q21 start operating. Accordingly, a current starts flowing through a path in the order of the terminal B2, the resistor Rp2, the transistor Q21, and the transistor Q2. A capacitor CB2 electrically connected between the emitter of the transistor Q21 and the other end of the phase shifter 14 has a function of efficiently applying the RF signal RF2 to the emitter of the transistor Q21 and promoting a decrease in the ON threshold voltage of the transistor Q21. It is preferable that the capacitor CB2 be provided. However, the capacitor CB2 is not essential and may be omitted.

The ON threshold voltage of the diode of each transistor varies according to a manufacturing process. Even transistors on different chips on the same wafer have different ON threshold voltages, and there is a difference in ON threshold voltage between the transistors Q1 and Q2 on the same chip on the same wafer. The power amplifier module 1 reduces the difference by selectively blowing out the above-described E fuses F.

Figure 9:
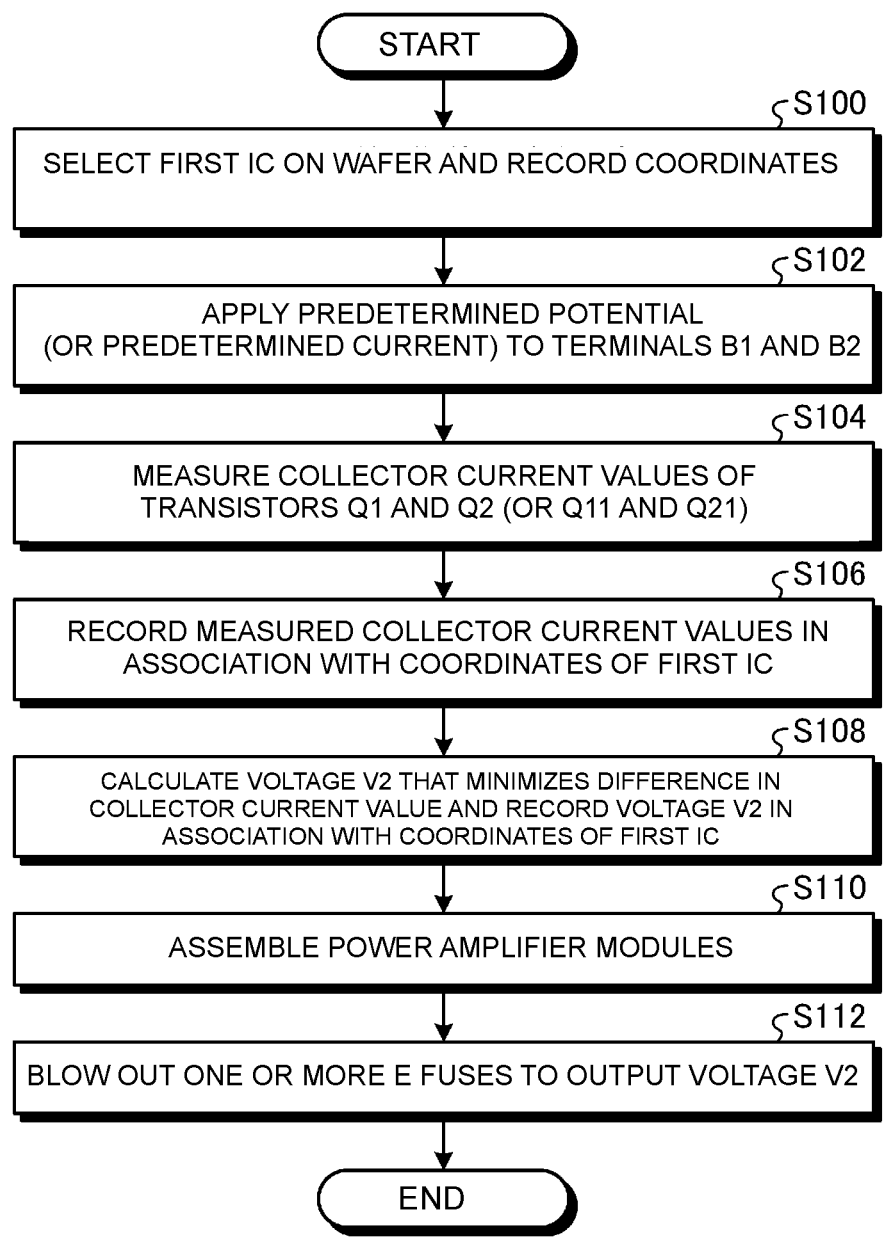
FIG. 9 is a flowchart illustrating a first adjustment procedure for the power amplifier module according to the first embodiment.

FIG. 9 is a flowchart illustrating a first adjustment procedure for the power amplifier module 1 according to the first embodiment. The procedure illustrated in FIG. 9 is performed, for example, on the compound semiconductor wafer that has not been cut into first ICs 2 with a dicing machine, by a semiconductor testing device (semiconductor tester).

One of a plurality of first ICs 2 on the wafer is selected, and the coordinates on the wafer of the selected first IC 2 are recorded (step S100). The coordinates on the wafer are an example of identification information identifying the selected first IC 2, and other information may be used as long as the selected first IC 2 can be identified.

A predetermined potential (or a predetermined current) is applied to the terminals B1 and B2 (step S102). The predetermined potential is, for example, a predetermined potential that is about 2.6 V or more, but the present disclosure is not limited thereto. In this case, if there is no variation (individual differences) between the transistors and diodes included in the first IC 2, the collector current of the transistor Q11 and the collector current of the transistor Q21 are the same, and the collector current of the transistor Q1 and the collector current of the transistor Q2 are the same. Actually, however, there is variation between the transistors and diodes included in the first IC 2. Thus, the collector current of the transistor Q11 and the collector current of the transistor Q21 are different from each other, and the collector current of the transistor Q1 and the collector current of the transistor Q2 are different from each other.

The collector current values of the respective transistors Q1 and Q2 (or the transistors Q11 and Q21) are measured (step S104). The collector currents of the transistors Q1 and Q2 finally directly affect the RF output signal RFout, and thus it is preferable to measure the collector current values of the respective transistors Q1 and Q2. However, if the collector current values of the respective transistors Q1 and Q2 are larger than a maximum current value measurable by the semiconductor tester, the collector current values of the respective transistors Q11 and Q21 may be measured.

In a case where the collectors of the transistors Q11 and Q21 are electrically connected to a single pad for saving the chip area, the collector current value of the transistor Q11 and the collector current value of the transistor Q21 may be measured in time division. For example, if the collectors of the transistors Q11 and Q21 are connected to another circuit, for example, a bias circuit that biases the driver amplifier 11, the measurement accuracy decreases. Thus, it is preferable that the collectors of the transistors Q11 and Q21 not be connected to another circuit, as illustrated in FIG. 5.

The two measured collector current values are recorded in association with the coordinates of the first IC 2 (step S106).

The voltage V2 that minimizes the difference between the collector current value of the transistor Q1 and the collector current value of the transistor Q2 when the transistor Q1 is biased for class AB operation (or class A operation or class B operation) and the transistor Q2 is biased for class C operation is calculated on the basis of diode characteristics. The calculated voltage V2 is recorded in association with the coordinates of the first IC 2 (step S108).

Steps S100 to S108 are performed on all the first ICs 2 on the compound semiconductor wafer.

The compound semiconductor wafer is cut with a dicing module into a plurality of first ICs 2, which are respectively mounted on a plurality of substrates. Accordingly, a plurality power amplifier modules 1 are assembled (step S110).

In each of the plurality of power amplifier modules 1, one or more of the E fuses F are blown out so that the buffer amplifier AMP2 outputs the voltage V2 calculated in step S108 (step S112). In a case where adjustment with the E fuses F is insufficient, the variable resistor VR1 is adjusted.

The first adjustment procedure is capable of reducing variation in the operation thresholds of diodes (pn junctions of transistors) of the power amplifier modules 1.

Figure 10:
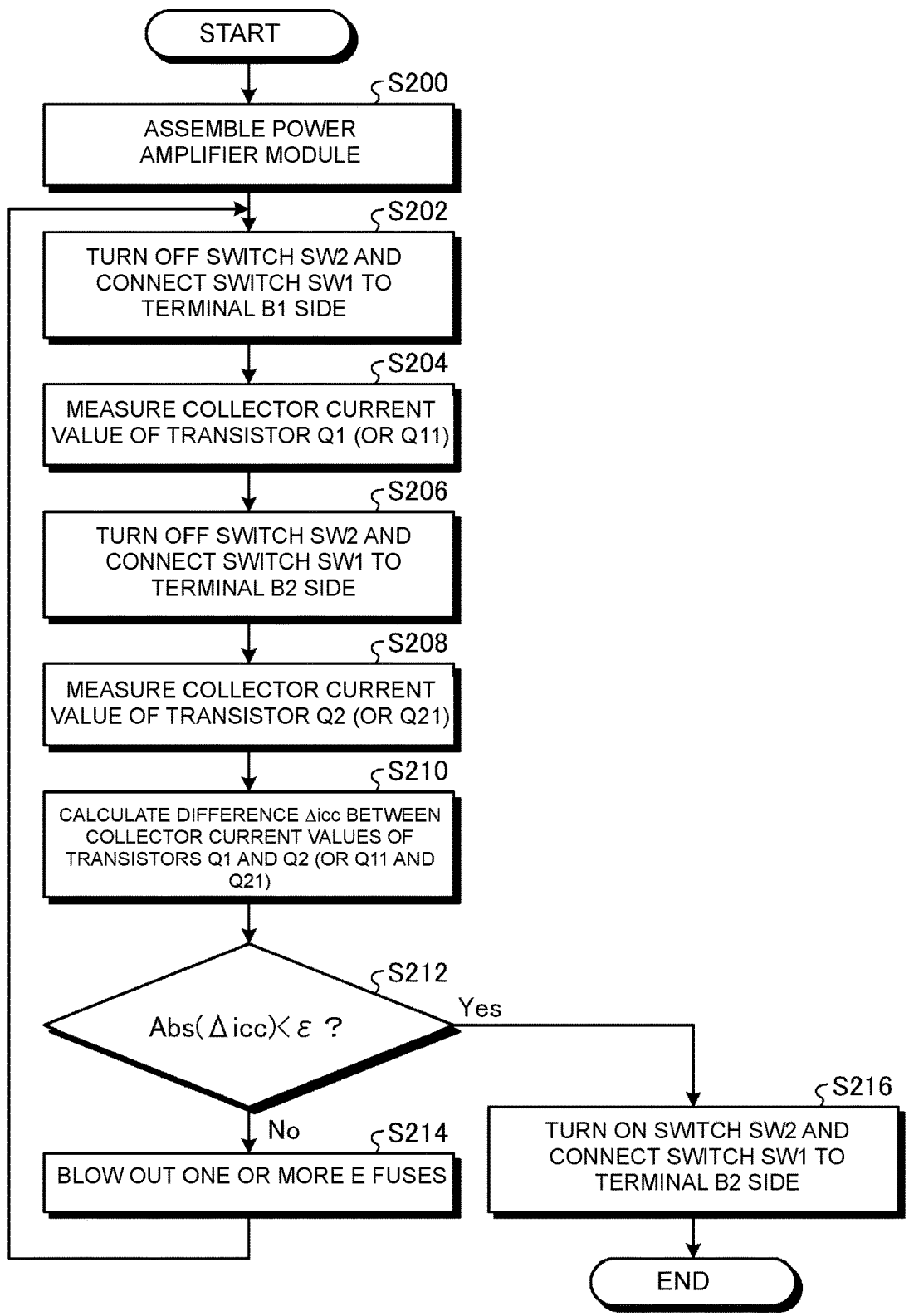
FIG. 10 is a flowchart illustrating a second adjustment procedure for the power amplifier module according to the first embodiment.

FIG. 10 is a flowchart illustrating a second adjustment procedure for the power amplifier module 1 according to the first embodiment. The procedure illustrated in FIG. 10 is performed, for example, on the assembled power amplifier module 1 by a power amplifier module testing device.

The first IC 2 and the second IC 3 are mounted on a substrate, and thereby the power amplifier module 1 is assembled (step S200).

The switch SW2 is turned off. Instead of turning off the switch SW2, the variable constant current output circuit 31 may be turned off. The switch SW1 is connected to the terminal B1 side (step S202). Accordingly, the transistors Q11 and Q1 operate.

The collector current value of the transistor Q1 (or Q11) is measured (step S204).

The switch SW2 is turned off. The switch SW1 is connected to the terminal B2 side (step S206). Accordingly, the transistors Q21 and Q2 operate.

The collector current value of the transistor Q2 (or Q21) is measured (step S208).

A difference Δicc between the collector current value of the transistor Q1 (or Q11) and the collector current value of the transistor Q2 (or Q21) is calculated (step S210).

It is determined whether or not an absolute value Abs(Δicc) of the difference Δicc is smaller than a predetermined allowable difference ε (step S212). If it is determined that the absolute value Abs(Δicc) is not smaller than the allowable difference ε (No in step S212), the process proceeds to step S214. If it is determined that the absolute value Abs(Δicc) is smaller than the allowable difference ε (Yes in step S212), the process proceeds to step S216.

If it is determined that the absolute value Abs(Δicc) is not smaller than the allowable difference ε (No in step S212), one or more of the E fuses F are blown out (step S214), and the process returns to step S202.

If it is determined that the absolute value Abs(Δicc) is smaller than the allowable difference ε (Yes in step S212), the switch SW2 is turned on, the switch SW1 is connected to the terminal B2 side (step S216), and the process ends.

Like the foregoing first adjustment procedure, the second adjustment procedure is capable of reducing variation in the operation thresholds of diodes (pn junctions of transistors) of the power amplifier module 1. Furthermore, compared with the foregoing first adjustment procedure, the second adjustment procedure does not require management of the coordinates of the first IC 2, history of wafer evaluation, and so forth, and can be simultaneously performed at the time of a quality test of the power amplifier module 1.

Figure 11:
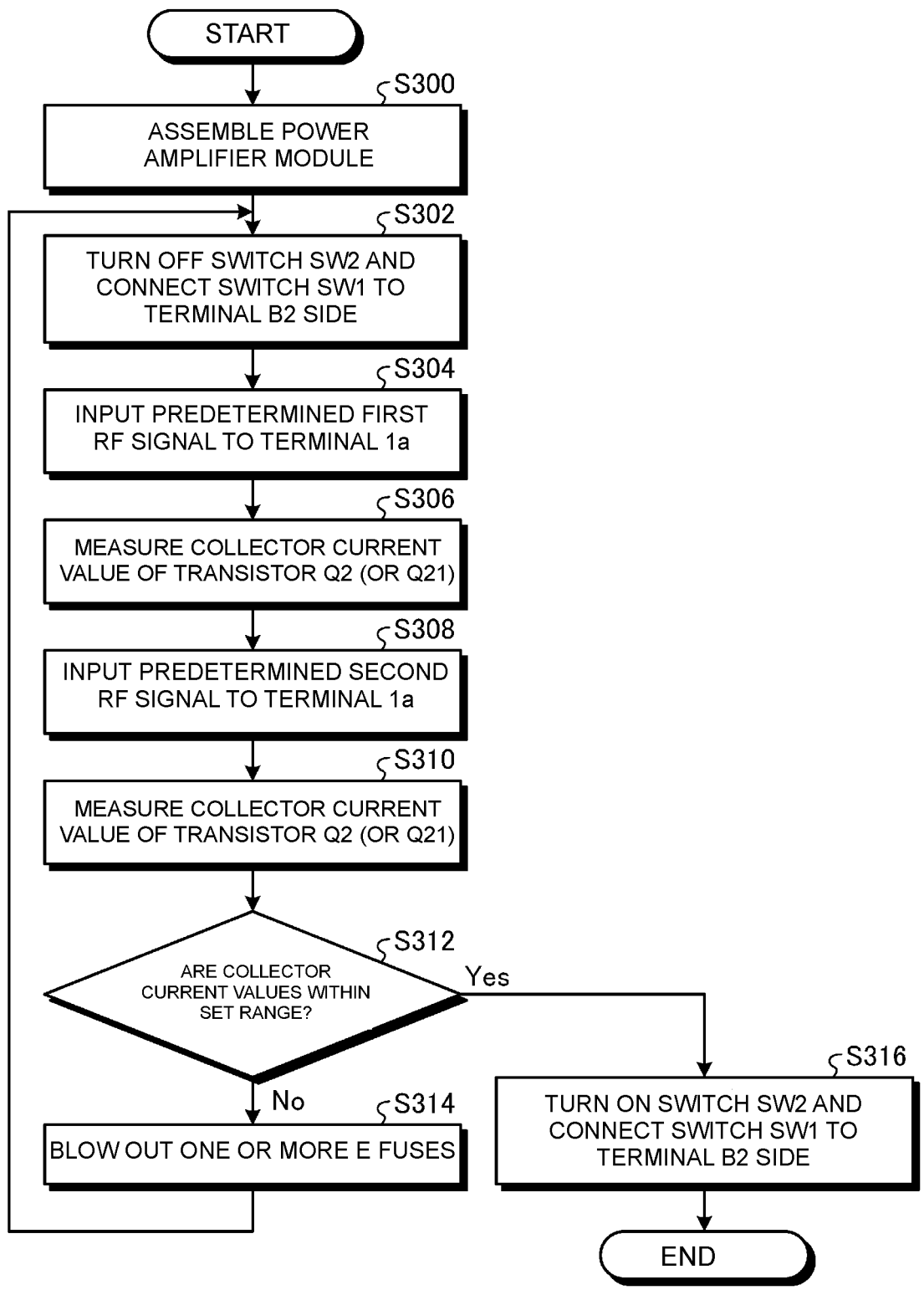
FIG. 11 is a flowchart illustrating a third adjustment procedure for the power amplifier module according to the first embodiment.

FIG. 11 is a flowchart illustrating a third adjustment procedure for the power amplifier module 1 according to the first embodiment. The procedure illustrated in FIG. 11 is performed, for example, on the assembled power amplifier module 1 by the power amplifier module testing device.

The first IC 2 and the second IC 3 are mounted on a substrate, and thereby the power amplifier module 1 is assembled (step S300).

The switch SW2 is turned off. Instead of turning off the switch SW2, the variable constant current output circuit 31 may be turned off. The switch SW1 is connected to the terminal B2 side (step S302). Accordingly, the transistors Q11 and Q1 are stopped, and the transistors Q21 and Q2 become capable of operating.

A predetermined first RF signal is inputted to the terminal 1a (step S304). The power of the first RF signal is set to, for example, a power around which the peak amplifier 13 starts class C operation (see FIG. 3).

The collector current value of the transistor Q2 (or Q21) is measured (step S306).

A predetermined second RF signal is inputted to the terminal 1a (step S308). The power of the second RF signal is set to, for example, a power around which the peak amplifier 13 starts class C operation (see FIG. 3).

The collector current value of the transistor Q2 (or Q21) is measured (step S310).

Steps S308 and S310 are for increasing determination accuracy and may be omitted.

It is determined whether or not the collector current values measured in steps S306 and S310 are within a predetermined set range (step S312). If it is determined that the collector current values are not within the set range (No in step S312), the process proceeds to step S314. If it is determined that the collector current values are within the set range (Yes in step S312), the process proceeds to step S316.

If it is determined that the collector current values are not within the set range (No in step S312), one or more of the E fuses F are blown out (step S314), and the process returns to step S302.

If it is determined that the collector current values are within the set range (Yes in step S312), the switch SW2 is turned on, the switch SW1 is connected to the terminal B2 side (step S316), and the process ends.

The third adjustment procedure is capable of reducing an influence of individual differences of elements including the phase shifters 14 and 15 and the matching circuit 16, compared with the foregoing first and second adjustment procedures that reduce only variation in the operation thresholds of diodes (pn junctions of transistors).

The circuit configuration of the power amplifier module 1 illustrated in FIG. 5 can be applied to each of the above-described first to third adjustment procedures.

As described above, the power amplifier module 1 is capable of reducing, by using the E fuses F, variation in characteristics of the peak amplifier system that performs class C operation and that is susceptible to individual differences within the Doherty amplifier. The power amplifier module 1 can be shipped to a manufacturer of wireless communication terminal apparatuses in a state in which variation in characteristics of the peak amplifier system is reduced. Thus, the power amplifier module 1 enables cost reduction of a test for applying DPD to wireless communication terminal apparatuses in the manufacturer of wireless communication terminal apparatuses.

Second Embodiment

Figure 12:
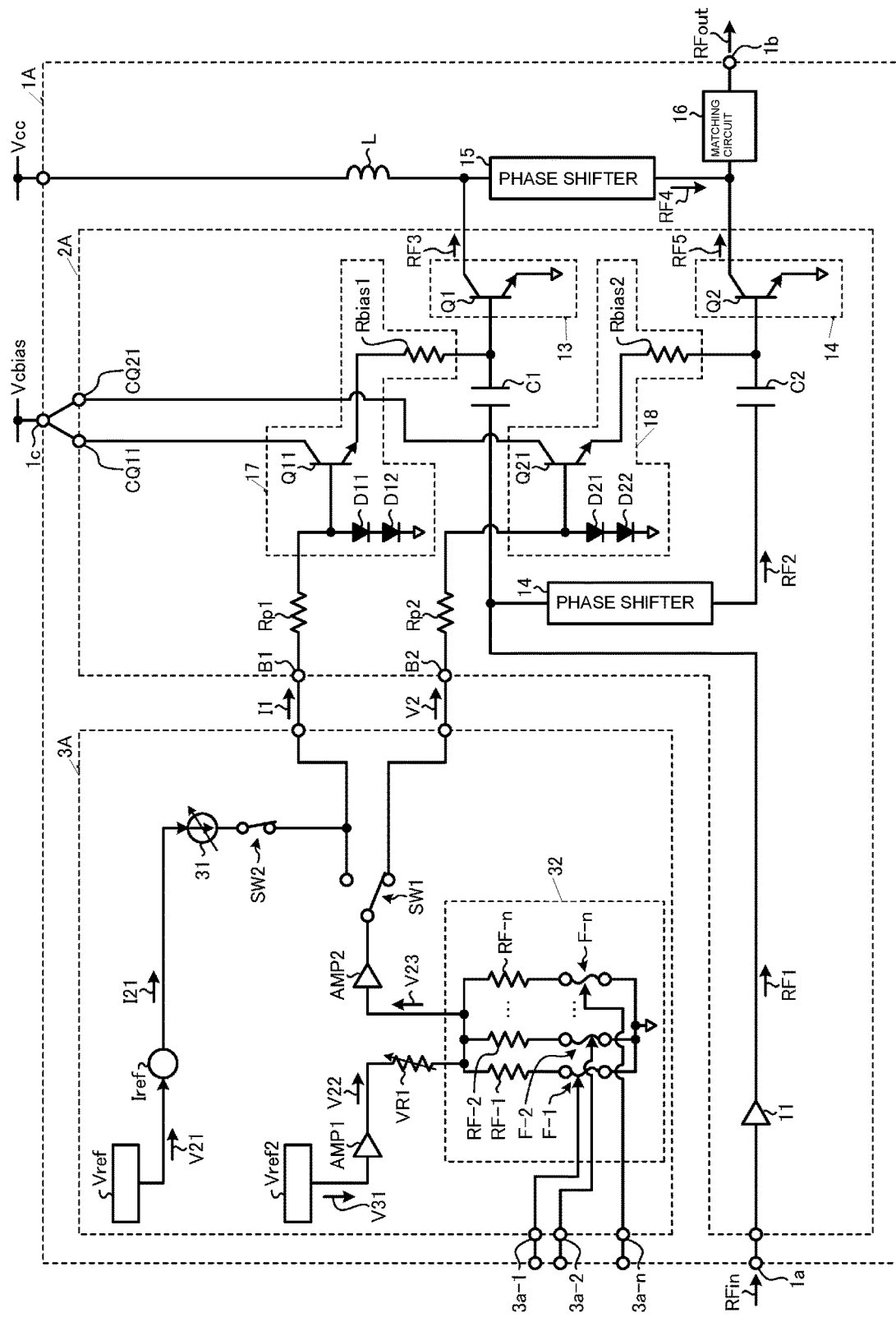
FIG. 12 is a diagram illustrating a circuit configuration of a power amplifier module according to a second embodiment.

FIG. 12 is a diagram illustrating a circuit configuration of a power amplifier module 1A according to a second embodiment.

Among the elements of the power amplifier module 1A according to the second embodiment, the same elements as those of the first embodiment will be denoted by the same reference numerals, and the description thereof will be omitted.

The power amplifier module 1A includes a first IC 2A and a second IC 3A.

The first IC 2A is different from the first IC 2 according to the first embodiment (see FIG. 5) in that the capacitor CB2 is not included between the emitter of the transistor Q21 and the other end of the phase shifter 14. The capacitor CB2 has a function of efficiently applying the RF signal RF2 to the emitter of the transistor Q21 and promoting a decrease in the ON threshold voltage of the transistor Q21, and thus it is preferable to provide the capacitor CB2. However, the capacitor CB2 is not essential and may be omitted.

The second IC 3A is different from the second IC 3 according to the first embodiment (see FIG. 5) in further including a reference voltage output circuit Vref2.

The reference voltage output circuit Vref2 outputs a reference voltage V31 to the buffer amplifier AMP1. The buffer amplifier AMP1 outputs the voltage V22 that is based on the reference voltage V31 to the one end of the variable resistor VR1.

The second IC 3 according to the first embodiment generates the voltage V2 on the basis of the reference voltage V21 outputted from the reference voltage output circuit Vref. On the other hand, the second IC 3A according to the second embodiment generates the voltage V2 on the basis of the reference voltage V31 outputted from the reference voltage output circuit Vref2. The reason is as follows.

The diode (pn junction) characteristics of an HBT have temperature dependence. For example, in the carrier amplifier system, the series connection between the diodes D11 and D12 has temperature characteristics that a voltage drops in response to an increase in temperature and that a voltage rises in response to a decrease in temperature. With the temperature characteristics, the diodes D11 and D12 are capable of suppressing the temperature characteristics of the transistors Q11 and Q1.

On the other hand, in the peak amplifier system, no current flows until the RF input signal RFin at a certain level is inputted. In particular, the diodes D21 and D22 are provided to achieve the same condition as that of the carrier amplifier system at the time of testing, and no current flows therethrough during an actual amplification operation. Thus, the diodes D21 and D22 are incapable of suppressing the temperature characteristic of the transistors Q21 and Q2.

Accordingly, the reference voltage output circuit Vref2 has characteristics that cancel the temperature characteristics of the transistors Q21 and Q2. Specifically, the reference voltage output circuit Vref2 has negative temperature dependence in which the reference voltage V31 drops in response to an increase in temperature and the reference voltage V31 rises in response to a decrease in temperature. Accordingly, the reference voltage output circuit Vref2 is capable of suppressing the temperature characteristics of the transistors Q21 and Q2.

As described above, like the power amplifier module 1, the power amplifier module 1A is capable of reducing, by using the E fuses F, variation in characteristics of the peak amplifier system that performs class C operation and that is susceptible to individual differences within the Doherty amplifier. Furthermore, the power amplifier module 1A is capable of reducing characteristic fluctuation of the peak amplifier system caused by temperature.

Third Embodiment

Figure 13:
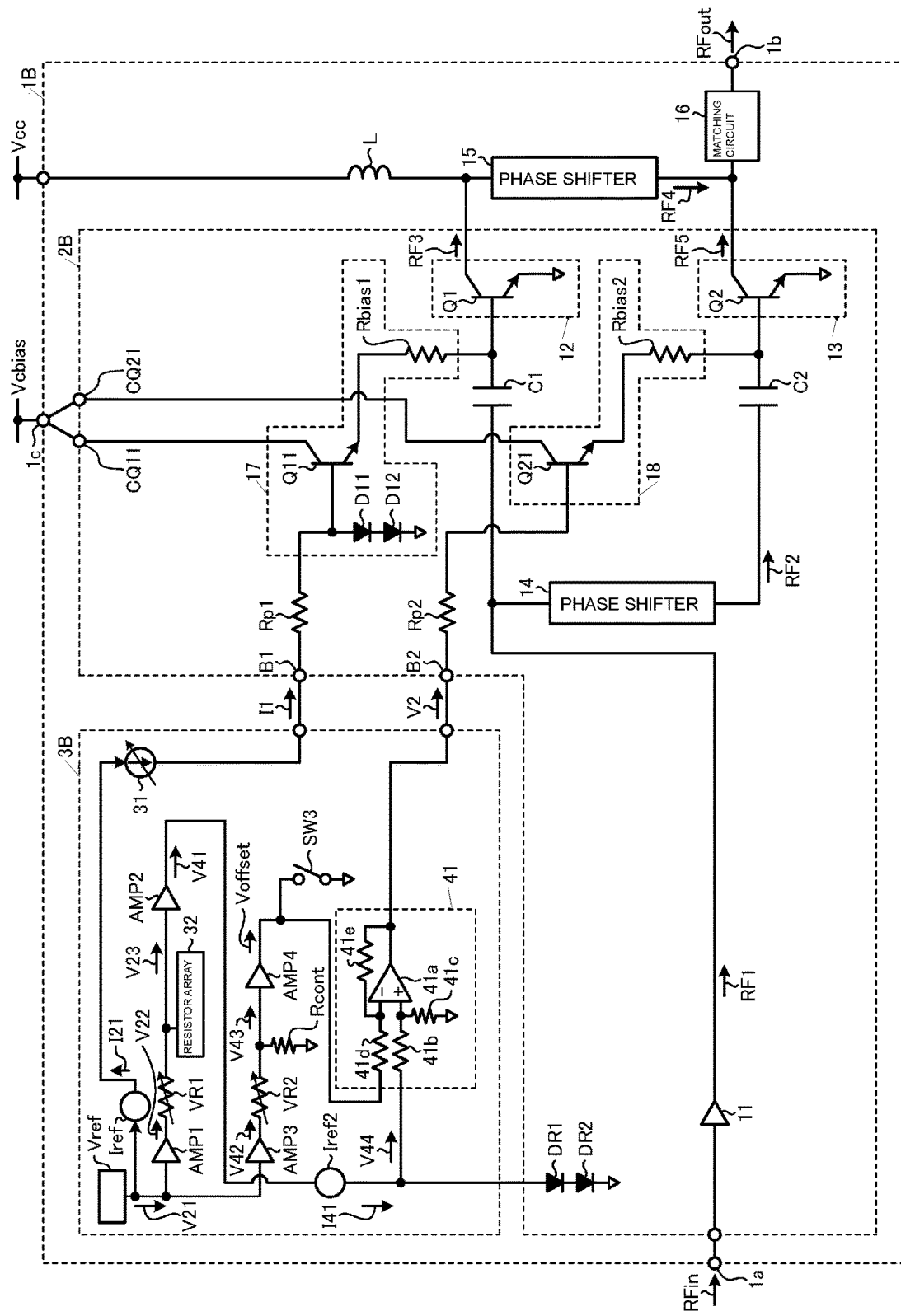
FIG. 13 is a diagram illustrating a circuit configuration of a power amplifier module according to a third embodiment.

FIG. 13 is a diagram illustrating a circuit configuration of a power amplifier module 1B according to a third embodiment.

Among the elements of the power amplifier module 1B according to the third embodiment, the same elements as those of the first or second embodiment will be denoted by the same reference numerals, and the description thereof will be omitted.

The power amplifier module 1B includes a first IC 2B and a second IC 3B.

The first IC 2B is different from the first IC 2 according to the first embodiment (see FIG. 5) in further including diodes DR1 and DR2. Each of the diodes DR1 and DR2 is, for example, a diode-connected HBT. A cathode of the diode DR1 is electrically connected to an anode of the diode DR2.

The diodes DR1 and DR2 correspond to an example of "a plurality of diodes" according to the present disclosure.

The first IC 2B is different from the first IC 2 in not including the capacitor CB2. The capacitor CB2 has a function of efficiently applying the RF signal RF2 to the emitter of the transistor Q21 and promoting a decrease in the ON threshold voltage of the transistor Q21, and thus it is preferable to provide the capacitor CB2. However, the capacitor CB2 is not essential and may be omitted.

The first IC 2B is different from the first IC 2 in not including the diodes D21 and D22. In the first embodiment, the diodes D21 and D22 are provided to achieve the same condition as that of the carrier amplifier system at the time of testing, and no current flows therethrough during an actual amplification operation. Thus, the first IC 2B does not include the diodes D21 and D22.

The second IC 3B is different from the second IC 3 according to the first embodiment (see FIG. 5) in further including buffer amplifiers AMP3 and AMP4, a variable resistor VR2, a resistor Rcont, a switch SW3, a reference current output circuit Iref2, and a subtraction circuit 41.

The reference current output circuit Iref2 corresponds to an example of a "constant current output circuit" according to the present disclosure.

The buffer amplifier AMP3 outputs a voltage V42 that is based on the reference voltage V21 to one end of the variable resistor VR2. The voltage V42 is, for example, the same as the reference voltage V21, but the present disclosure is not limited thereto. A series circuit made up of the variable resistor VR2 and the resistor Rcont divides the voltage V42 by using resistance and outputs a voltage V43. The buffer amplifier AMP4 outputs a voltage Voffset that is based on the voltage V43. The voltage Voffset is, for example, the same as the voltage V43, but the present disclosure is not limited thereto. The voltage Voffset corresponds to a differential voltage between a class AB bias (or a class A bias or a class B bias) for driving the carrier amplifier 12 and a class C bias for driving the peak amplifier 13. The voltage Voffset is a voltage that is based on the reference voltage V21.

The reference current output circuit Iref2 outputs a current I41 that is based on a voltage V41 to an anode of the diode DR1. A series-connected circuit made up of the diodes DR1 and DR2 generates a constant voltage V44. For example, assuming that each of the diodes DR1 and DR2 generates a voltage of about 1.3 V, the series-connected circuit made up of the diodes DR1 and DR2 generates a voltage of about 2.6 V.

The subtraction circuit 41 outputs the voltage V2, which is the difference between the voltage V44 and the voltage Voffset, to the terminal B2 of the first IC 2B. The subtraction circuit 41 is, for example, a differential amplifier using an operational amplifier 41a.

The voltage V44 is inputted to a non-inverting input terminal of the operational amplifier 41a via a resistor 41b. The non-inverting input terminal of the operational amplifier 41a is electrically connected to a reference potential via a resistor 41c. The voltage Voffset is inputted to an inverting input terminal of the operational amplifier 41a via a resistor 41d. The inverting input terminal of the operational amplifier 41a is electrically connected to an output terminal of the operational amplifier 41a via a resistor 41e.

The resistance value of the resistor 41d is represented by $R_1$, the resistance value of the resistor 41e is represented by $R_2$, the resistance value of the resistor 41b is represented by $R_3$, and the resistance value of the resistor 41c is represented by $R_4$. When $R_1$ is equal to $R_3$ and $R_2$ is equal to $R_4$, the voltage V2 is expressed by the following equation (1).

$$V2 = R_2/R_1(V44-\text{Voffset}) \tag{1}$$

That is, the gain of the subtraction circuit 41 is $R_2/R_1$. The subtraction circuit 41 is capable of adjusting the voltage V2 by adjusting the resistance values $R_1$ to $R_4$.

The power amplifier module 1A according to the second embodiment includes the reference voltage output circuit Vref2 having temperature characteristics, thereby suppressing the temperature characteristics of the transistors Q21 and Q2. On the other hand, the power amplifier module 1B according to the third embodiment includes the diodes DR1 and DR2 included in the first IC 2B, and supplies the current I41 to the diodes DR1 and DR2 to generate a voltage of two stages of diodes. The diodes DR1 and DR2 and the diodes D11 and D12 are included in the first IC 2B. Thus, it is expected that the voltage of the diodes DR1 and DR2 is the same as the voltage of the diodes D11 and D12.

As with the diodes D11 and D12 having temperature characteristics that a voltage drops in accordance with an increase in temperature and a voltage rises in accordance with a decrease in temperature, the diodes DR1 and DR2 have temperature characteristics that a voltage drops in accordance with an increase in temperature and a voltage rises in accordance with a decrease in temperature.

The current I41 has a value that is based on a voltage obtained by adjusting the reference voltage V21 by using a resistance voltage divider circuit made up of the variable resistor VR1 and the resistor array 32. The voltage Voffset has a value that is obtained by adjusting the reference voltage V21 by using the buffer amplifier AMP3, a resistance voltage divider circuit made up of the variable resistor VR2 and the resistor Rcont, and the buffer amplifier AMP4.

In the case of applying the second and third adjustment procedures described in the first embodiment to the power amplifier module 1B, the switch SW3 is closed (turned on) to terminate the voltage Voffset, and the subtraction circuit 41 is caused to operate as a buffer amplifier. In this case, the voltage V2 is the same as the voltage of the diodes DR1 and DR2, that is, the voltage of the diodes D11 and D12. Accordingly, the power amplifier module 1B is capable of causing the peak amplifier system to operate as with the carrier amplifier system, and thus the second and third adjustment procedures can be applied.

As described above, like the power amplifier module 1, the power amplifier module 1B is capable of reducing, by using the E fuses F, variation in characteristics of the peak amplifier system that performs class C operation and that is susceptible to individual differences within the Doherty amplifier. Furthermore, the power amplifier module 1B is capable of reducing characteristic fluctuation caused by temperature more accurately than the power amplifier module 1A.

Fourth Embodiment

Figure 14:
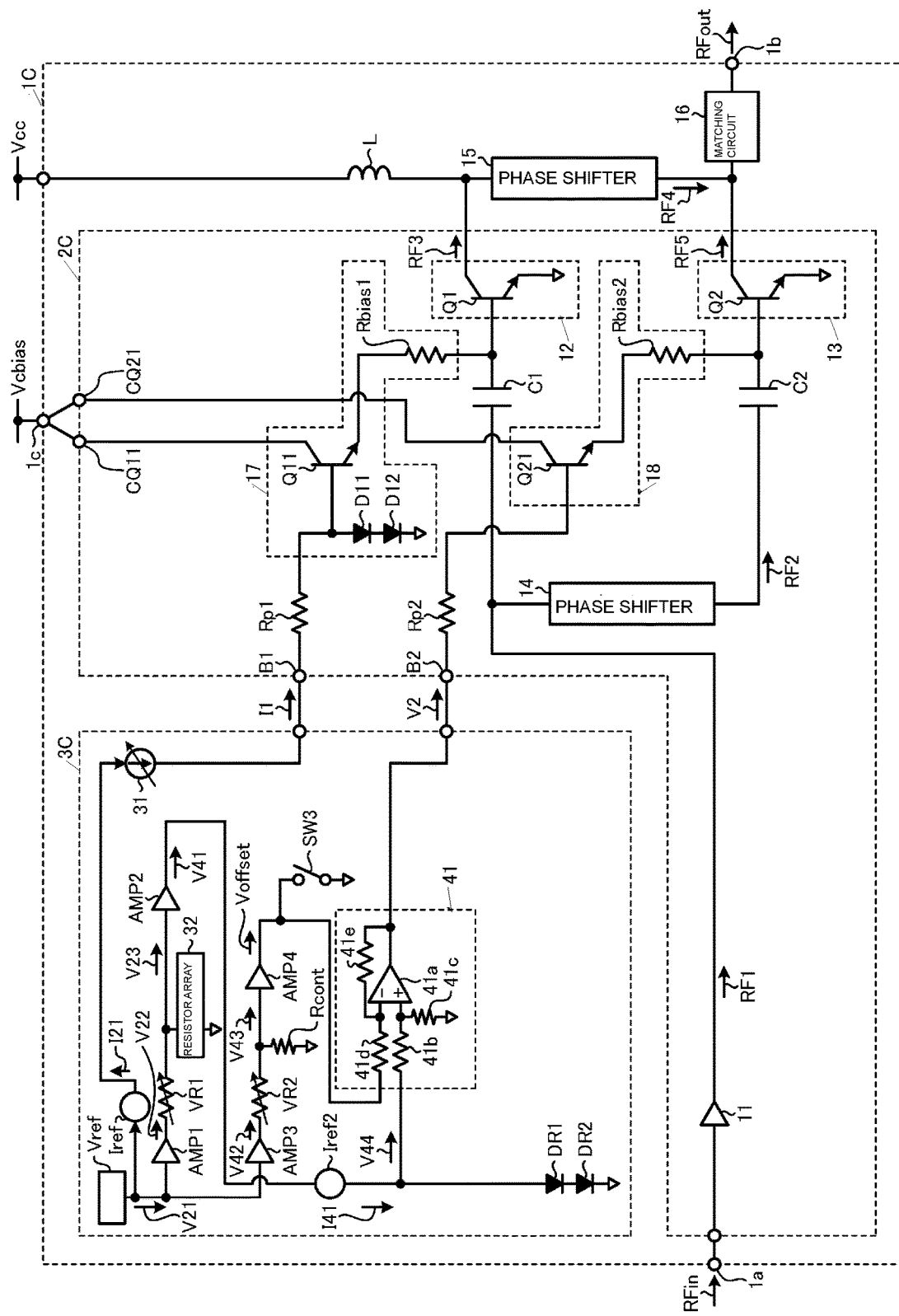
FIG. 14 is a diagram illustrating a circuit configuration of a power amplifier module according to a fourth embodiment.

FIG. 14 is a diagram illustrating a circuit configuration of a power amplifier module 1C according to a fourth embodiment.

Among the elements of the power amplifier module 1C according to the fourth embodiment, the same elements as those of the first to third embodiments will be denoted by the same reference numerals, and the description thereof will be omitted.

The power amplifier module 1C includes a first IC 2C and a second IC 3C.

The first IC 2C is different from the first IC 2B according to the third embodiment (see FIG. 13) in not including the diodes DR1 and DR2.

The second IC 3C is different from the second IC 3B according to the third embodiment (see FIG. 13) in further including the diodes DR1 and DR2.

The diodes DR1 and DR2 correspond to an example of "a plurality of diodes" according to the present disclosure.

Specifically, in the power amplifier module 1B according to the third embodiment, the diodes DR1 and DR2 are included in the first IC 2B (the IC chip of a compound semiconductor substrate). In contrast, in the power amplifier module 1C according to the fourth embodiment, the diodes DR1 and DR2 are included in the second IC 3C (the IC chip of a Si substrate).

The diodes DR1 and DR2 included in the IC chip of the Si substrate have temperature characteristics similar to those of the diodes D11 and D12 included in the IC chip of the compound semiconductor substrate, but the absolute value of the ON threshold voltage is different. Thus, the subtraction circuit 41 having a function of amplifying the voltage V44 generates the voltage V2.

As described above, like the power amplifier module 1, the power amplifier module 1C is capable of reducing, by using the E fuses F, variation in characteristics of the peak amplifier system that performs class C operation and that is susceptible to individual differences within the Doherty amplifier. Furthermore, the power amplifier module 1C is capable of reducing characteristic fluctuation caused by temperature more accurately than the power amplifier module 1A, without increasing the number of connection wiring lines between the first IC 2C and the second IC 3C.

Fifth Embodiment

Figure 15:
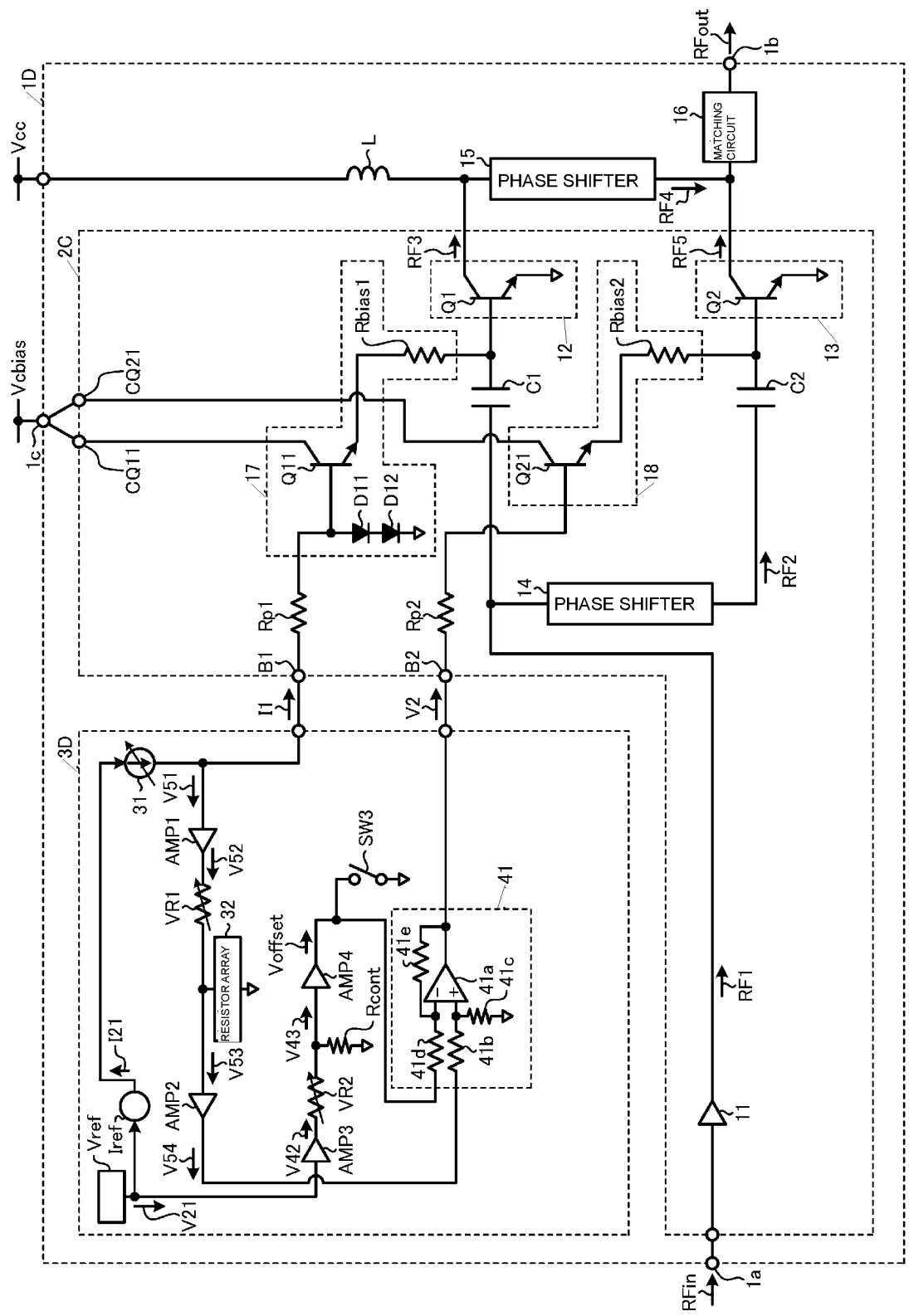
FIG. 15 is a diagram illustrating a circuit configuration of a power amplifier module according to a fifth embodiment.

FIG. 15 is a diagram illustrating a circuit configuration of a power amplifier module 1D according to a fifth embodiment.

Among the elements of the power amplifier module 1D according to the fifth embodiment, the same elements as those of the first to fourth embodiments will be denoted by the same reference numerals, and the description thereof will be omitted.

The power amplifier module 1D includes the first IC 2C and a second IC 3D.

The second IC 3D includes the reference voltage output circuit Vref, the reference current output circuit Iref, and the variable constant current output circuit 31. The second IC 3D also includes the buffer amplifier AMP1, the variable resistor VR1, the resistor array 32, and the buffer amplifier AMP2. The second IC 3D further includes the buffer amplifier AMP3, the variable resistor VR2, the resistor Rcont, the buffer amplifier AMP4, the switch SW3, and the subtraction circuit 41.

The variable constant current output circuit 31 corresponds to an example of a "constant current output circuit" according to the present disclosure.

In the power amplifier module 1B according to the third embodiment (see FIG. 13), the second IC 3B outputs the voltage V2 on the basis of the voltage of the diodes DR1 and DR2 included in the first IC 2B. On the other hand, in the power amplifier module 1D according to the fifth embodiment, the second IC 3D outputs the voltage V2 on the basis of the voltage of the diodes D11 and D12 included in the first bias circuit 17.

An input terminal of the buffer amplifier AMP1 is electrically connected to the terminal B1. That is, a voltage V51 applied to the buffer amplifier AMP1 is the voltage of the diodes D11 and D12.

The buffer amplifier AMP1 outputs a voltage V52 that is based on the voltage V51 to one end of the variable resistor VR1. The series circuit made up of the variable resistor VR1 and the resistor array 32 divides the voltage V52 by using resistance and outputs a voltage V53. The buffer amplifier AMP2 outputs a voltage V54 that is based on the voltage V53 to the non-inverting input terminal of the operational amplifier 41a via the resistor 41b.

As described above, like the power amplifier module 1, the power amplifier module 1D is capable of reducing, by using the E fuses F, variation in characteristics of the peak amplifier system that performs class C operation and that is susceptible to individual differences within the Doherty amplifier. Furthermore, the power amplifier module 1D is capable of reducing characteristic fluctuation caused by temperature more accurately than the power amplifier module 1C, without increasing the number of connection wiring lines between the first IC 2C and the second IC 3D.

Sixth Embodiment

Figure 16:
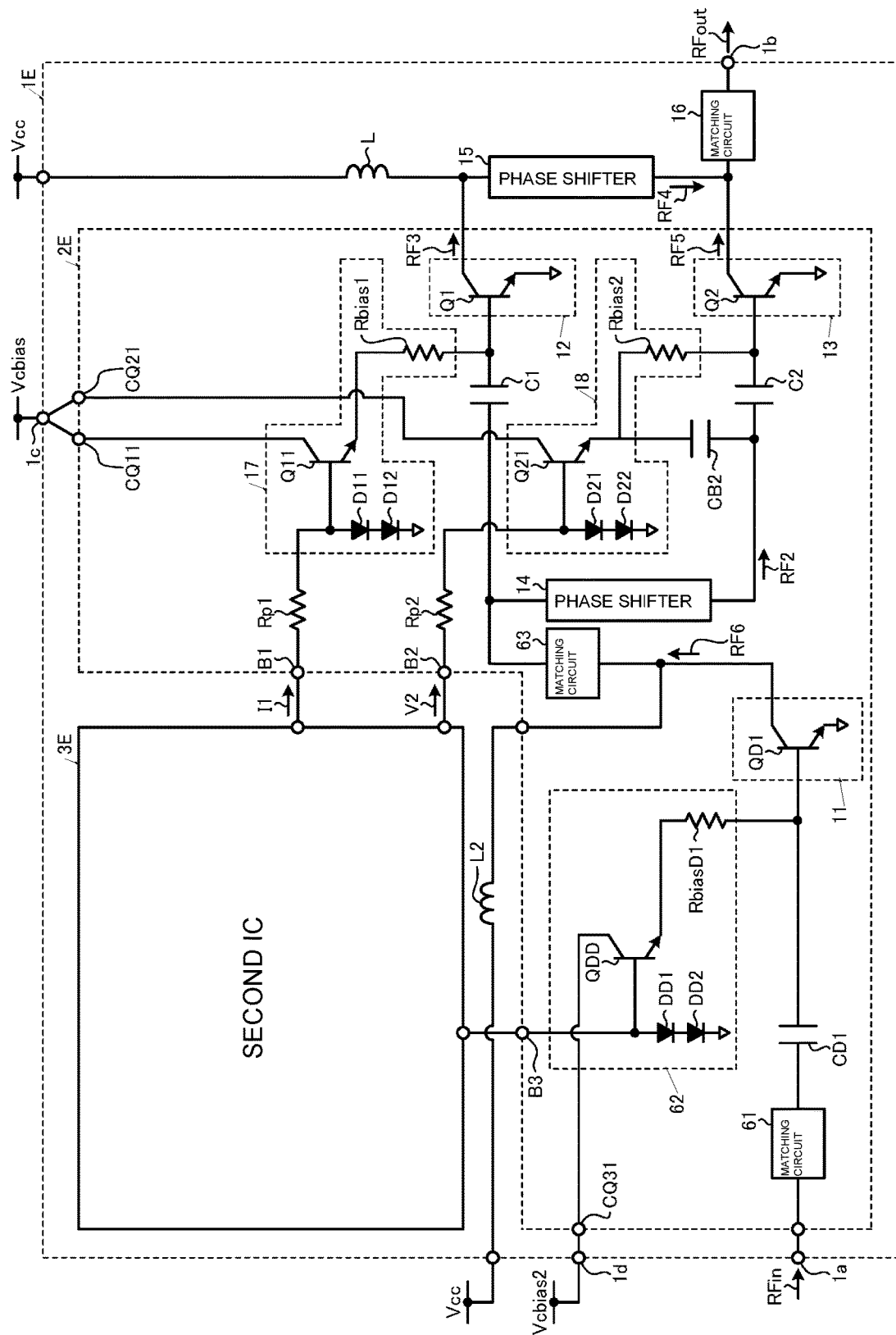
FIG. 16 is a diagram illustrating a circuit configuration of a power amplifier module according to a sixth embodiment.

FIG. 16 is a diagram illustrating a circuit configuration of a power amplifier module 1E according to a sixth embodiment.

Among the elements of the power amplifier module 1E according to the sixth embodiment, the same elements as those of the first to fifth embodiments will be denoted by the same reference numerals, and the description thereof will be omitted.

The power amplifier module 1E includes a first IC 2E and a second IC 3E. The first IC 2E includes a matching circuit 61, a DC cut capacitor CD1, the driver amplifier 11, a third bias circuit 62, and a matching circuit 63.

The RF input signal RFin is inputted to the matching circuit 61 via the terminal 1a. The RF signal RF1 is supplied to a base of a transistor QD1 in the driver amplifier 11 via the matching circuit 61 and the DC cut capacitor CD1.

An emitter of the transistor QD1 is electrically connected to a reference potential. A collector of the transistor QD1 is electrically connected to the power supply potential Vcc via a choke inductor L2. The transistor QD1 outputs an RF signal RF6, obtained by amplifying the RF input signal RFin, to the DC cut capacitor C1 and the phase shifter 14 via the matching circuit 63.

The third bias circuit 62 includes diodes DD1 and DD2, a transistor QDD, and a resistor RbiasD1. Each of the diodes DD1 and DD2 is, for example, a diode-connected HBT.

A bias current (bias voltage) is inputted to an anode of the diode DD1 from the second IC 3E via a terminal B3. A cathode of the diode DD1 is electrically connected to an anode of the diode DD2. A cathode of the diode DD2 is electrically connected to a reference potential. A series-connected circuit made up of the diodes DD1 and DD2 generates a constant voltage.

The voltage of the series-connected circuit made up of the diodes DD1 and DD2 is inputted to a base of the transistor QDD. A collector of the transistor QDD is electrically connected to a power supply potential Vcbias2 via a terminal CQ31 and a terminal 1d. An emitter of the transistor QDD is electrically connected to the base of the transistor QD1 via the resistor RbiasD1. In other words, the transistor QDD and the resistor RbiasD1 are emitter-follower connected. A base current of the transistor QD1 is determined on the basis of a voltage applied to the base of the transistor QDD.

As described above, the terminal 1d for supplying power to the third bias circuit 62 is different from the terminal 1c for supplying power to the first bias circuit 17 and the second bias circuit 18. This configuration reduces an influence of the third bias circuit 62 on measurement of a collector current of the transistor Q11 in the first bias circuit 17 and a collector current of the transistor Q21 in the second bias circuit 18. Accordingly, the power amplifier module 1E is capable of accurately setting the bias of the carrier amplifier 12 and the peak amplifier 13.

While specific embodiments of the disclosure have been described above to facilitate the understanding of the present disclosure, it is to be understood that variations and modifications will be apparent to those skilled in the art without departing from the scope and spirit of the disclosure. The present disclosure includes the equivalents thereof. The scope of the disclosure, therefore, is to be determined solely by the following claims.

What is claimed is:

1. A control circuit configured to control a Doherty amplifier including a carrier amplifier and a peak amplifier, the control circuit comprising:
    an adjustable resistor having a resistance value that is irreversibly adjustable, the adjustable resistor being configured to determine, based on the resistance value, a bias of the peak amplifier; and
    a constant current output circuit configured to output, to a plurality of diodes connected in series to each other, a constant current that is based on a voltage obtained by adjusting a reference voltage by using the adjustable resistor.

2. The control circuit according to claim 1, wherein the adjustable resistor includes
    a plurality of resistance elements each having a first end and a second end, the first ends being electrically connected to each other, and
    a plurality of electronic fuses each having a first end and a second end, the first ends of the plurality of electronic fuses being electrically connected to the second ends of the plurality of resistance elements in one-to-one correspondence, and the second ends of the plurality of electronic fuses being electrically connected to each other.

3. The control circuit according to claim 1, wherein the plurality of resistance elements have identical resistance values.

4. The control circuit according to claim 1, wherein the plurality of resistance elements have different resistance values.

5. The control circuit according to claim 2, wherein selective blowout of the plurality of electronic fuses varies the resistance value of the adjustable resistor.

6. The control circuit according to claim 2, wherein the resistance value of the adjustable resistor increases when at least one of the plurality of electronic fuses is blown out.

7. The control circuit according to claim 2, wherein the plurality of electronic fuses are irreversible elements.

8. The control circuit according to claim 1, wherein the adjustable resistor includes
    a plurality of resistance elements each having a first end and a second end, the first ends being electrically connected to each other,
    a plurality of switches each having a first end and a second end, the first ends of the plurality of switches being electrically connected to the second ends of the plurality of resistance elements in one-to-one correspondence, and the second ends of the plurality of switches being electrically connected to each other, and
    a one-time read-only memory configured to store and output a plurality of signals that control the plurality of switches to be turned on or off.

9. The control circuit according to claim 8, wherein selective turning on or off of the plurality of switches varies the resistance value of the adjustable resistor.

10. The control circuit according to claim 8, wherein the resistance value of the adjustable resistor increases when at least one of the plurality of switches is turned off.

11. The control circuit according to claim 8, wherein the one-time read-only memory is an irreversible element.

12. The control circuit according to claim 1, further comprising a voltage output circuit configured to output, to a bias circuit configured to bias the peak amplifier, a voltage obtained by adjusting a reference voltage by using the adjustable resistor.

13. The control circuit according to claim 1, further comprising
    a voltage output circuit configured to output, to a bias circuit configured to bias the peak amplifier, a voltage obtained by adjusting, using the adjustable resistor, a reference voltage that drops in response to an increase in temperature and rises in response to a decrease in temperature.

14. The control circuit according to claim 1, further comprising:
    a differential amplifier configured to output, to a bias circuit configured to bias the peak amplifier, a voltage that is a difference between a voltage of the plurality of diodes and a voltage that is based on the reference voltage.

15. The control circuit according to claim 14, wherein the plurality of diodes are disposed in or on a chip including the Doherty amplifier.

16. The control circuit according to claim 14, wherein the plurality of diodes are disposed in or on a chip including the adjustable resistor, the constant current output circuit, and the differential amplifier.

17. A control circuit configured to control a Doherty amplifier including a carrier amplifier and a peak amplifier, the control circuit comprising:
- an adjustable resistor having a resistance value that is irreversibly adjustable, the adjustable resistor being configured to determine, based on the resistance value, a bias of the peak amplifier;
- a constant current output circuit configured to output, to a first bias circuit configured to bias the carrier amplifier, a constant current that is based on a reference voltage; and
- a differential amplifier configured to output, to a second bias circuit configured to bias the peak amplifier, a voltage that is a difference between a voltage obtained by adjusting, by using the adjustable resistor, a voltage of an input terminal of the first bias circuit, and a voltage that is based on the reference voltage.

18. A power amplifier comprising:
- a first integrated circuit comprising the Doherty amplifier including the carrier amplifier and the peak amplifier; and
- a second integrated circuit comprising the control circuit according to claim 1.

19. The power amplifier according to claim 18, wherein the first integrated circuit further comprises a first resistor and a first bias circuit.

20. The power amplifier according to claim 18, wherein the first integrated circuit further comprises a second resistor and a second bias circuit.

21. The control circuit according to claim 17, wherein the adjustable resistor includes
- a plurality of resistance elements each having a first end and a second end, the first ends being electrically connected to each other, and
- a plurality of electronic fuses each having a first end and a second end, the first ends of the plurality of electronic fuses being electrically connected to the second ends of the plurality of resistance elements in one-to-one correspondence, and the second ends of the plurality of electronic fuses being electrically connected to each other.

* * * * *